(12) United States Patent
Beltrand

(10) Patent No.: US 11,869,147 B2
(45) Date of Patent: Jan. 9, 2024

(54) NEURAL NETWORK FOR OUTPUTTING A PARAMETERIZED 3D MODEL

(71) Applicant: DASSAULT SYSTEMES, Velizy-Villacoublay (FR)

(72) Inventor: Nicolas Beltrand, Velizy-Villacoublay (FR)

(73) Assignee: DASSAULT SYSTEMES, Velizy-Villacoublay (FR)

(*) Notice: Subject to any disclaimer, the term of this patent is extended or adjusted under 35 U.S.C. 154(b) by 210 days.

(21) Appl. No.: 17/408,319

(22) Filed: Aug. 20, 2021

(65) Prior Publication Data

US 2022/0058866 A1  Feb. 24, 2022

(30) Foreign Application Priority Data

Aug. 20, 2020  (EP) .................................. 20305939

(51) Int. Cl.
*G06T 17/10* (2006.01)
*G06N 3/044* (2023.01)

(52) U.S. Cl.
CPC ............. *G06T 17/10* (2013.01); *G06N 3/044* (2023.01); *G06T 2200/24* (2013.01)

(58) Field of Classification Search
CPC ..... G06T 17/10; G06T 2200/24; G06T 17/00; G06F 30/27; G06F 2111/08; G06N 3/044
See application file for complete search history.

(56) References Cited

U.S. PATENT DOCUMENTS

| 2020/0129862 A1* | 4/2020 | Liu ........................ G06T 17/10 |
| 2020/0151923 A1 | 5/2020 | Bergin et al. |
| 2023/0070008 A1* | 3/2023 | Kulon ....................... G06T 3/40 |

FOREIGN PATENT DOCUMENTS

| EP | 3 675 062 A1 | 7/2020 |
| EP | 3 675 063 A1 | 7/2020 |

OTHER PUBLICATIONS

Yang, C., Sharon, D. and van de Panne, M., 2005, August. Sketch-based modeling of parameterized objects. In SIGGRAPH sketches (p. 89). (Year: 2005).*
Chaudhuri, S., Ritchie, D., Wu, J., Xu, K., & Zhang, H. (2020, May). "Learning generative models of 3D structures." In Computer Graphics Forum (vol. 39, No. 2, pp. 643-666). (Year: 2020).*
(Continued)

*Primary Examiner* — King Y Poon
*Assistant Examiner* — Vincent Peren
(74) *Attorney, Agent, or Firm* — Oblon, McClelland, Maier & Neustadt, L.L.P.

(57) ABSTRACT

A computer-implemented method of machine-learning including obtaining an architecture for a neural network which is configured to take as an input a 2D sketch, and to output a 3D model represented by the 2D sketch. The 3D model is a parameterized 3D model defined by a set of parameters consisting of a first subset of one or more parameters and a second subset of one or more parameters. The neural network is configured to selectively output a value for the set and take as input a value for the first subset from a user and output a value for the second subset. The method of machine-learning also includes teaching the neural network.

17 Claims, 9 Drawing Sheets

(56) References Cited

OTHER PUBLICATIONS

Li, Changjian, et al. "Bendsketch: Modeling freeform surfaces through 2d sketching." ACM Transactions on Graphics (TOG) 36.4 (2017): 1-14. (Year: 2017).*
Huang, H., Kalogerakis, E., Yumer, E. and Mech, R., 2016. Shape synthesis from sketches via procedural models and convolutional networks. IEEE transactions on visualization and computer graphics, 23(8), pp. 2003-2013. (Year: 2016).*
Li, C., Pan, H., Liu, Y., Tong, X., Sheffer, A. and Wang, W., 2018. Robust flow-guided neural prediction for sketch-based freeform surface modeling. ACM Transactions on Graphics (TOG), 37(6), pp. 1-12. (Year: 2018).*
Johanna Delanoy, et al.; "3D Sketching Using Multi-View Deep Volumetric Prediction"; Proceedings of the ACM on Computer Graphics and Interactive Techniques 1.1, 2018; 15 pgs.
Mathias Elitz et al.; "Sketch-Based Shape Retrieval"; ACM Transactions on Graphics (Proc. SIGGRAPH), 2012; vol. 31, No.4; 10 pgs.
Yuwei Li, et al.; "SweepCanvas: Sketch-Based 3D Phototyping on an RGB-D Image"; Session: 3D Sketching: UIST 2017; Oct. 22-25, 2017; Quebec City, Canada; 13 pgs.
Bastien Wally, et al.; "Sketch-Based Modeling of Parametric Shapes"; Expressive 2019; The 8th ACM/EG Expressive Symposium—Posters, Demos, and Artwork: C. Kaplan, A. Forbes, and S.Diverdi (Editors); 2 pgs.
Hang Su, et al.; "Multi-View Convolutional Neural Networks for 3D Shape Recognition"; 2015 IEEE International Conference on Computer Vision (ICCV), Dec. 7, 2015; XP032866419; [Retrieved on Feb. 17, 2016]; 9 pgs.
Extended Search Report dated Feb. 4, 2021 in Europe Patent Appiication 203059399-1224; 11 pgs.
Anh Thai et al.; "3D Reconstruction of Novel Object Shapes from Single Images"; Jun. 14, 2020; XP055785588; Retrieved From the Internet: URL:https://arvix.org/pdf/2006.07752v1.pdf [retrieved on Mar. 15, 2021]: 21 pgs.
Xiaofeng Liu, et al.; "Auto 3D: Novel View Synthesis Through Unsupervisely Learned Variational Viewpoint and Global 3D Representation"; In: "Lecture Notes in Computer Science"; Jul. 13, 2020; Springer Berlin Heidelberg, Berlin, Germany; XP055785387; Retreived From the Internet: URL:https://arvix.org/pdf/2007.06620v1v1.pdf; 19 pgs.
Paul Henderson, et al.; "Learning Single-Image 3D Reconstruction by Generative Modelling of Shape, Pose and Shading" International Journal of Computer Vision; Kluwer Academic Publishers, Norwell, US; vol. 128; No. 4, Oct. 16, 2019; XP037090848; 20 pgs.
Extended Search Report dated Mar. 23, 2021 in Europe Patent Apptication No. 20305938.1-1203; 11 pgs.

* cited by examiner

To generate a new 3D model of the selected type
Calls the CVAE

To generate a new 3D model with no type condition
Calls the VAE

Different propositions

NEURAL NETWORK FOR OUTPUTTING A PARAMETERIZED 3D MODEL

CROSS-REFERENCE TO RELATED APPLICATIONS

This application claims priority under 35 U.S.C. § 119 or 365 to European Application No. 20305939.9, filed Aug. 20, 2020. The entire contents of the above application(s) are incorporated herein by reference.

TECHNICAL FIELD

The disclosure relates to the field of computer programs and systems, and more specifically to methods, programs, data structures, and systems related to a neural network which is configured to take as an input a 2D sketch, and to output a 3D model represented by the 2D sketch.

BACKGROUND

A number of systems and programs are offered on the market for the design, the engineering, and the manufacturing of objects. CAD is an acronym for Computer-Aided Design, e.g., it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise. The PLM solutions provided by Dassault Systèmes (under the trademarks CATIA, ENOVIA, and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation, and decision support that drives optimized product definition, manufacturing preparation, production, and service.

In this context, researchers have been looking for solutions to compute a 3D model represented by an input 2D sketch. This is a complicated problem, as depending on the view angle chosen for the input 2D sketch, it might be difficult to find the 3D model intended by the user. For example, a 2D sketch of a rectangle can be a representation of either a 3D cylinder (from a front view) or a cuboid (from any canonical view). Further, the 2D sketch may be imprecisely drawn as its lines may be not smooth or not straight, or its perspective may be unfaithful to the reality. These imprecisions make this problem even harder to solve.

Different approaches to solving this problem exist in the prior art.

DELANOY et al., *3D Sketching using Multi-View Deep Volumetric Prediction, Proceedings of the ACM on Computer Graphics and Interactive Techniques* 1.1, 2018, pages 1-22, proposes a data-driven approach by learning a deep convolutional neural network (CNN) to reconstruct 3D shapes from one or more drawings. The CNN predicts occupancy of a voxel grid from a line drawing and provides an initial 3D reconstruction as soon as the user completes a single drawing of the desired shape. This single-view network is complemented with an updater CNN that refines an existing prediction given a new drawing of the shape created from a novel viewpoint.

WAILY and BOUSSEAU, *Sketch-Based Modeling of Parametric Shapes, ACM/EG Expressive Symposium—Posters, Demos, and Artworks,* 2019, proposes a sketch-based modeling system using deep convolutional networks to interpret sketches of parametric shapes. The proposed method is focused on the creation of simple shapes (cuboids, cylinders, cones, spheres, pyramids) relying on two types of deep convolutional networks for sketch interpretation. First, a classification network recognizes what shape is drawn. Then, a parameter estimation network predicts the position and dimensions of the recognized shape. There is one such network per shape category since different categories have different parameters. Further, the shadow that each shape casts on the ground plane when lit from above is rendered and provided to the deep network in order to allow the method to disambiguate the elevation of the shape with respect to the ground.

LI et al., *SweepCanvas: Sketch-based 3D prototyping on an RGB-D image,* 2017, pages 387-399, proposes a sketch-based interactive tool for exploratory 3D modeling on top of an RGBD image to offer end-users a way to create 3D models on an image. The tool comprises a sketch-based modeling interface, which takes a pair of user strokes as input and instantly generates a curved 3D surface by sweeping one stroke along the other. The proposed method applies a Markov random field (MRF)-based optimization procedure to extract pairs of spatial planes from the context to position and sweep the strokes.

EITZ et al., *Sketch-Based Shape Retrieval, ACM Transactions on Graphics (Proc. SIGGRAPH),* 2012, Vol. 31, No. 4, pages 31:1-31:10, proposes a method for 3D object retrieval based on sketched feature lines as input using a bag-of-features (BOF) approach over computer-generated line drawings of the objects. The method proposes a collection of matching models from a dataset to the user based on geometric similarity.

Within this context, there is still a need for improved solutions to output, from an input 2D sketch, a 3D model represented by the 2D sketch.

SUMMARY

It is therefore provided a computer-implemented method of machine-learning. The method comprises providing an architecture for a neural network which is configured to take as an input a 2D sketch, and to output a 3D model represented by the 2D sketch. The 3D model is a parameterized 3D model defined by a set of parameters consisting of a first subset of one or more parameters and a second subset of one or more parameters. The neural network is configured to selectively output a value for the set and take as input a value for the first subset from a user and output a value for the second subset. The method also comprises learning the neural network.

The method of machine-learning may comprise one or more of the following:
- the architecture comprises a piece of data, the neural network being configured for selective outputting a value for the set, to produce a first value for the piece of data, to determine the value for the first subset based on said first value for the piece of data, and to further determine the value for the second subset based on said first value for the piece of data; for selective taking as input the value for the first subset from the user and outputting the value of the second subset, to produce a second value for the piece of data based on the value for the first subset, to output the value for the second subset based on the second value for the piece of data;

the value for the first subset corresponds to an image of a function of the first value for the piece of data, the second value being a preimage of the value for the first subset according to the function;

the piece of data is a vector which represents a probability distribution for the first subset, and the function is the argmax function;

the second value of the piece of data is a vector having a value of 1 for coordinates corresponding to the value for the first subset, and a value of 0 for all other coordinates;

the 3D model is defined by a section and an extrusion, the first subset consisting of a number representing a type of the section;

the number represents the number of sides forming the section;

the second subset comprises a parameter defining the extrusion and/or a parameter further defining the section;

the parameter further defining the section comprises a list of positional parameters, each positional parameter optionally comprising one couple of 3D points; and/or the neural network comprises a recurrent neural network (RNN) configured to output a value for the list, the neural network being optionally further configured to output a value for the extrusion based on a final state of the RNN.

It is further provided a computer-implemented method of 3D design. The method of 3D design comprises providing a neural network learnt according to the method of machine-learning. The method of 3D design further comprises providing a 2D sketch, providing, by a user, a value for the first subset, applying the neural network to the 2D sketch and taking as input the value for the first subset from the user, to output a value for the second subset.

The method of 3D design may further comprise, prior to the user providing the value for the first subset applying the neural network to the 2D sketch, to output one or more respective values each for the set, and displaying one or more 3D models represented by the 2D sketch and each defined by a respective value outputted for the set, the user providing the value for the first subset while the one or more 3D models are displayed.

It is further provided a computer program comprising instructions which, when executed on a computer system, cause the computer system to perform the method.

It is further provided a data structure representing the learnt neural network learnt.

It is further provided a device comprising memory having recorded thereon the computer program and/or the data structure. The device may alternatively form or serve as a non-transitory computer-readable medium, or, as a computer system comprising a processor coupled to the memory.

BRIEF DESCRIPTION OF THE DRAWINGS

Embodiments will now be described, by way of non-limiting example, and in reference to the accompanying drawings, where.

DETAILED DESCRIPTION

Figure 1:
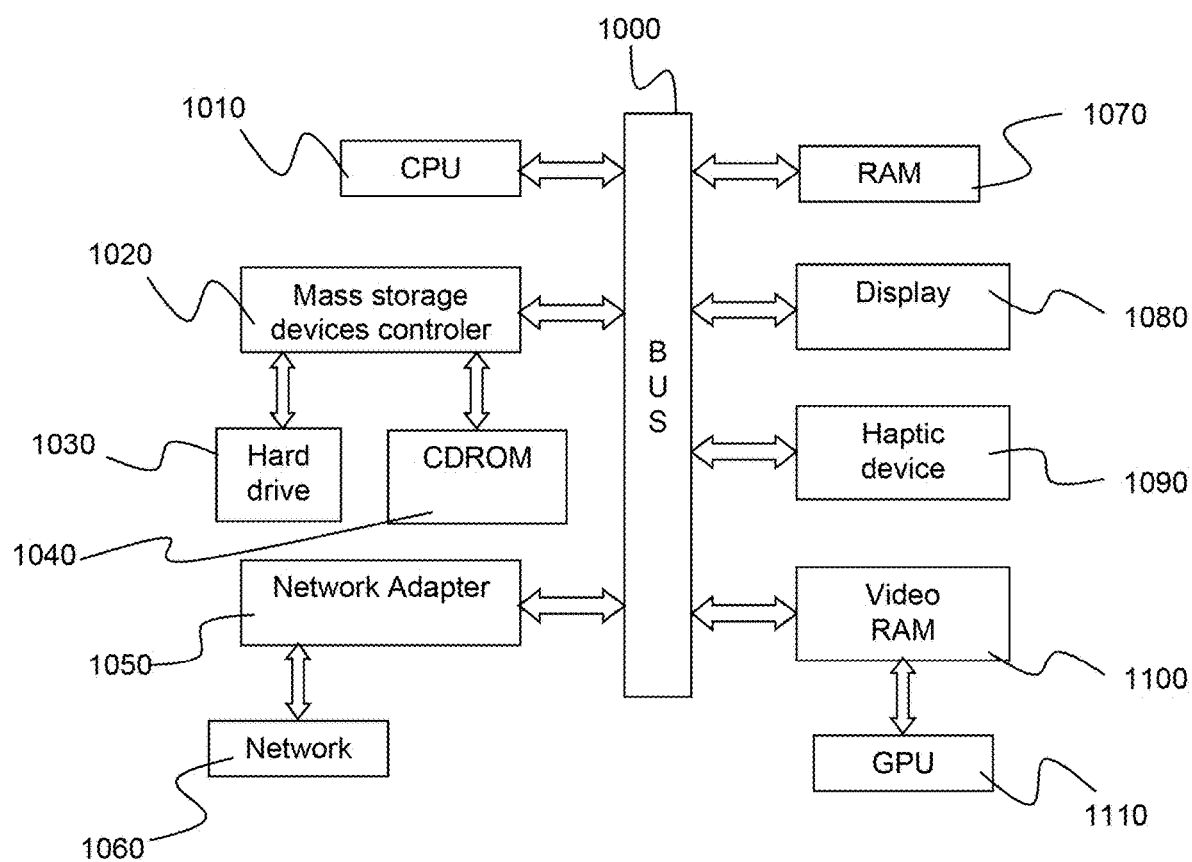
FIG. 1 shows an example of the system.

It is hereby proposed a computer-implemented method of machine-learning. The method of machine learning comprises providing an architecture for a neural network. The neural network is configured to take as an input a 2D sketch, and to output a 3D model represented by the 2D sketch. The method of machine learning also comprises learning the neural network. The neural network is configured to output a 3D model represented by one 2D sketch. This represents high ergonomics for the user to infer, i.e., compute, a 3D model based on a single corresponding 2D sketch.

As known from the field of machine-learning, a neural network is a function comprising operations according to an architecture, each operation being defined by data including weight values. The architecture of the neural network defines the operand of each operation and the relation between the weight values. The learning of a neural network thus includes determining values of the weights based on a dataset configured for such learning. For that, the dataset includes data pieces each forming a respective training sample. The training samples represent the diversity of the situations where the neural network is to be used after being learnt. Any dataset referred herein may comprise a number of training samples higher than 1000, 10000, 100000, or 1000000.

The method of machine-learning may be part of a machine-learning process that comprises a computer-implemented method for forming such a dataset, which may be referred to as "the dataset-forming method". The dataset-forming method may be performed before the method of machine-learning, or alternatively interlaced with the method of machine-learning. The dataset-forming method comprises providing (e.g., synthetizing) one or more 3D models. The dataset-forming method further comprises determining (e.g., synthetizing) one or more respective 2D sketches each representing the respective 3D model (e.g., based on the generated 3D model), and inserting in the dataset, one or more training samples each including the (e.g., synthetized) 3D model and a respective (e.g., synthetized) 2D sketch.

The learning of the neural network method may for example be performed at least partly based on the dataset formed by the dataset-forming method, in examples after the dataset-forming method. Such a machine-learning process is particularly efficient and provides improved accuracy.

Alternatively, a machine-learning process may comprise the dataset-forming method and performing, based on the dataset, any other computer-implemented method (than the proposed learning method) for learning the neural network. Yet alternatively, a machine-learning process may comprise performing the learning method on a dataset provided by any other computer-implemented method (than the proposed dataset-forming method), such as another method for forming a dataset or retrieval of a dataset as such.

It is also proposed a computer-implemented method of 3D design. The method of 3D design comprises providing a neural network learnt according to the machine-learning method. The method of 3D design also comprises providing a 2D sketch. The method of 3D design then comprises applying the neural network to the 2D sketch, to output a 3D model represented by the 2D sketch. The 3D design process designates any action or series of actions which is at least part of a process of elaborating a 3D model. Thus, the method may comprise creating the 3D model from scratch. The method eventually allows users to input a 2D sketch and output one or more 3D models, which is an ergonomic manner to perform 3D design.

The 3D design method forms an improved solution for CAD design. Notably, the learnt neural network is usable for converting a 2D sketch into a solid CAD. In the context of CAD, performing such a conversion with a learnt neural network allows achieving benefits provided by the field of machine-learning, such as fast or real-time execution, non-requirement of tedious prior manual programming/coding, and accuracy of the result. Herein, the accuracy refers to a value of a 3D similarity evaluated between the 3D model the 3D shape intended by the user when sketching the 2D sketch, e.g. optionally measured as the value of a 2D similarity evaluated between a 2D projection of (e.g. characteristic edges of) the 3D model and the 2D sketch. The learning method thus improves ergonomics in the context of 3D design. The method of 3D design may output one single 3D model or several propositions for the 3D model to the user. In the latter case the user may choose the one according to her/his intent in the design process. In examples, the method of 3D design may comprise displaying a 3D graphical representation of one or more 3D models represented by the 2D sketch.

The method of 3D design may be iterated. In such a case, the method of 3D design comprises providing the neural network, and iteratively providing a 2D sketch, applying the neural network to each 2D sketch, to output each time (e.g., automatically) a new 3D model represented by the 2D sketch. The method may comprise adding each 3D model newly obtained to the current design, thereby iteratively/incrementally constructing a (final) 3D model object comprised of the outputted individual 3D model objects. Each providing of a 2D sketch may be performed by a user, for example by sketching (e.g., via touch technology, such as a touch screen or touch pad). The final 3D model object may represent a mechanical part of a mechanical assembly, as further described hereinbelow.

The method of 3D design may comprise the method of machine-learning, or it may be performed afterwards, e.g., as part of the machine-learning process.

A modeled object is any object defined by data stored e.g. in a database. By extension, the expression "modeled object" designates the data itself. According to the type of the system used for designing the modeled object, the modeled objects may be defined by different kinds of data. In the context of CAD, a modeled object may typically be a 3D modeled object (or 3D model), e.g., representing a product such as a part, or an assembly of parts, or possibly an assembly of products. A 3D model is a modeled object which forms a 3D representation of a solid, e.g., a 3D spatial distribution of material constitutive of a real-world object. The real-world object may be a mechanical part or an assembly of parts, or possibly an assembly of products in a mechanical design process. A 3D representation allows the viewing of the part from all angles. For example, a 3D model may be handled and turned around any of its axes, or around any axis in the screen on which the representation is displayed. A 3D model may represent a skin (i.e. outer surface) of the solid. A 3D model may be provided to a CAD system for being displayed to a user and/or for the user to perform one or more CAD design operations on the 3D model. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process.

The system may indeed be any combination of a CAD system, a CAE system, a CAM system, a PDM system, and/or a PLM system. In those different systems, modeled objects are defined by corresponding data. One may accordingly speak of CAD object, PLM object, PDM object, CAE object, CAM object, CAD data, PLM data, PDM data, CAM data, CAE data. However, these systems are not exclusive one of the other, as a modeled object may be defined by data corresponding to any combination of these systems. A system may thus well be both a CAD and PLM system.

By CAD system, it is additionally meant any system adapted at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts. In the context of CAD, a modeled object may typically be a 3D modeled object, e.g., representing a product such as a part or an assembly of parts, or possibly an assembly of products.

A 2D sketch is a 2D image representing a 3D model on a 2D plane. The 2D sketch may have been established by a user. In particular, the 2D sketch may be a freehand sketch. Alternatively, the 2D sketch may have been synthetized, i.e., artificially, and automatically by a computer system. In particular, the freehand drawings in the dataset-forming method may be synthetic. A 2D sketch is thus a 2D image data structure which comprises one or more (2D planar) strokes representing a 3D shape from a respective viewpoint from where the 3D shape is visible. The one or more strokes are defined in a same plane and represent a perspective of the 3D shape from the respective viewpoint. Each stroke is a continuous or substantially continuous curve defined in the plane.

In examples, for any 2D sketch herein, the background of the 2D image may be unicolor or alternatively not unicolor. The background may, for example, be a photograph, above which a user may add strokes. The strokes may be identifiable, for example, based on a contrast with the rest of the photograph being higher than a predetermined threshold. In the machine-learning process, the background may be replaced by a unicolor background of a first color and the identified strokes of the 2D sketch may be rendered in a second color. In examples, the first color may be black, and the second color may be white. In other examples, the first color may be white, and the second color may be black. All the methods of the machine-learning process, comprising machine-learning method and dataset-forming method, and the method of 3D design may use a same first and second color. Alternatively, the methods of the machine-learning process and the method of 3D design may use different first and/or second colors in combination with one or more transforming steps to keep the consistency of their respective input and output.

In examples, for any 2D sketch herein, one or more (e.g., all) strokes may each have an extremity point having a distance from another stroke (e.g., from an extremity point of another stroke), for example lower than a predetermined threshold, for example 10 or 5 mm. In examples, for any 2D sketch herein, the strokes represent freely the 3D shape. This means that the strokes can be defined in any order and with no predefined constraint (such as having necessarily parallel and/or orthogonal strokes), and they are not organized in clusters (e.g. obtainable based on distance) each representing a planar face of the solid. In examples, any 2D sketch herein may alternatively or additionally be provided in a raw format, e.g. without any label associated to the strokes (e.g. action annotation, such as creation, extrusion, bending) and/or without any additional data (e.g. pictures, user-definition of parallel lines, depth images).

The sketching of a 2D sketch may be performed by graphical interaction with a screen of the computer, by activating sequentially (e.g. substantially continuously) a series of pixels of the screen defining the stroke. The activation may be performed via a haptic device acting on the pixels, such as a mouse (e.g. the cursor movement defining the stroke) or via user interaction with a touch-screen or a touch-pad (e.g., the interaction comprising physically touch-drawing the stroke on the touch-screen or touch-pad). This is well-known in the field of CAD as sketch-design or stroke-design. In alternatives, a scan of a paper-sketched drawing or any other image may be inputted to the inference method. Yet alternatively, the freehand drawing may be retrieved from memory or received from a distant computer system, e.g. having been produced by another user and/or by any of the previously-described techniques.

Any method herein may be included in a manufacturing process, which may comprise, after performing the method, producing a physical product corresponding to the modeled object. In any case, the modeled object designed by the method may represent a manufacturing object. The modeled object may thus be a modeled solid (i.e. a modeled object that represents a solid). The manufacturing object may be a product, such as a part, or an assembly of parts. Because the method improves the design of the modeled object, the method also improves the manufacturing of a product and thus increases productivity of the manufacturing process.

Any 3D shape herein may represent the geometry of a product to be manufactured in the real world, such as a (e.g., mechanical) part or assembly of parts. (or equivalently an assembly of parts, as the assembly of parts may be seen as a part itself from the point of view of the methods, or the methods may be applied independently to each part of the assembly), or more generally any rigid body assembly (e.g. a mobile mechanism). The product may be one of the products in various and unlimited industrial fields, including: aerospace, architecture, construction, consumer goods, high-tech devices, industrial equipment, transportation, marine, and/or offshore oil/gas production or transportation. The 3D shape may thus represent an industrial product which may be any mechanical part, such as a part of a terrestrial vehicle (including e.g. car and light truck equipment, racing cars, motorcycles, truck and motor equipment, trucks and buses, trains), a part of an aerial vehicle (including e.g. airframe equipment, aerospace equipment, propulsion equipment, defense products, airline equipment, space equipment), a part of a naval vehicle (including, e.g., navy equipment, commercial ships, offshore equipment, yachts and workboats, marine equipment), a general mechanical part (including, e.g., industrial manufacturing machinery, heavy mobile machinery or equipment, installed equipment, industrial equipment product, fabricated metal product, tire manufacturing product), an electro-mechanical or electronic part (including e.g., consumer electronics, security and/or control and/or instrumentation products, computing and communication equipment, semiconductors, medical devices and equipment), a consumer good (including, e.g., furniture, home and garden products, leisure goods, fashion products, hard goods retailers' products, soft goods retailers' products), a packaging (including e.g. food and beverage and tobacco, beauty and personal care, household product packaging).

Any of the methods is computer-implemented. This means that steps (or substantially all the steps) of the method are executed by at least one computer, or any system alike. Thus, steps of the method are performed by the computer, possibly fully automatically, or, semi-automatically. In examples, the triggering of at least some of the steps of the method may be performed through user-computer interaction. The level of user-computer interaction required may depend on the level of automatism foreseen and put in balance with the need to implement user's wishes. In examples, this level may be user-defined and/or pre-defined.

It is also proposed a computer program comprising instructions which, when executed on a computer system (i.e., a system with a processor coupled to a memory), cause the computer system to perform any of the methods. The computer program may comprise instructions executable by a computer, the instructions comprising means for causing the above system to perform the method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the method.

It is also proposed a data structure representing a neural network learnt according to the method of machine-learning and/or the method of 3D design.

It is also proposed a device comprising memory having recorded thereon the computer program and/or the data structure. The device may form or serve as a non-transitory computer-readable medium on a SaaS (Software as a service) or another server, or a cloud-based platform, or the like. The device may alternatively comprise a processor coupled to the memory. The device may thus form a system in whole or in part (e.g., the device is a subsystem of the overall system). The system may further comprise a graphical user interface coupled to the processor.

The computer system may comprise a processor coupled to a memory and a graphical user interface (GUI), the memory having recorded thereon a computer program comprising instructions for performing the method. The memory may also store a database. The memory is any hardware adapted for such storage, possibly comprising several physical distinct parts (e.g. one for the program, and possibly one for the database).

FIG. 1 shows an example of a computer system.

The client computer of the example comprises a central processing unit (CPU) 1010 connected to an internal communication BUS 1000, a random-access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

Figure 2:
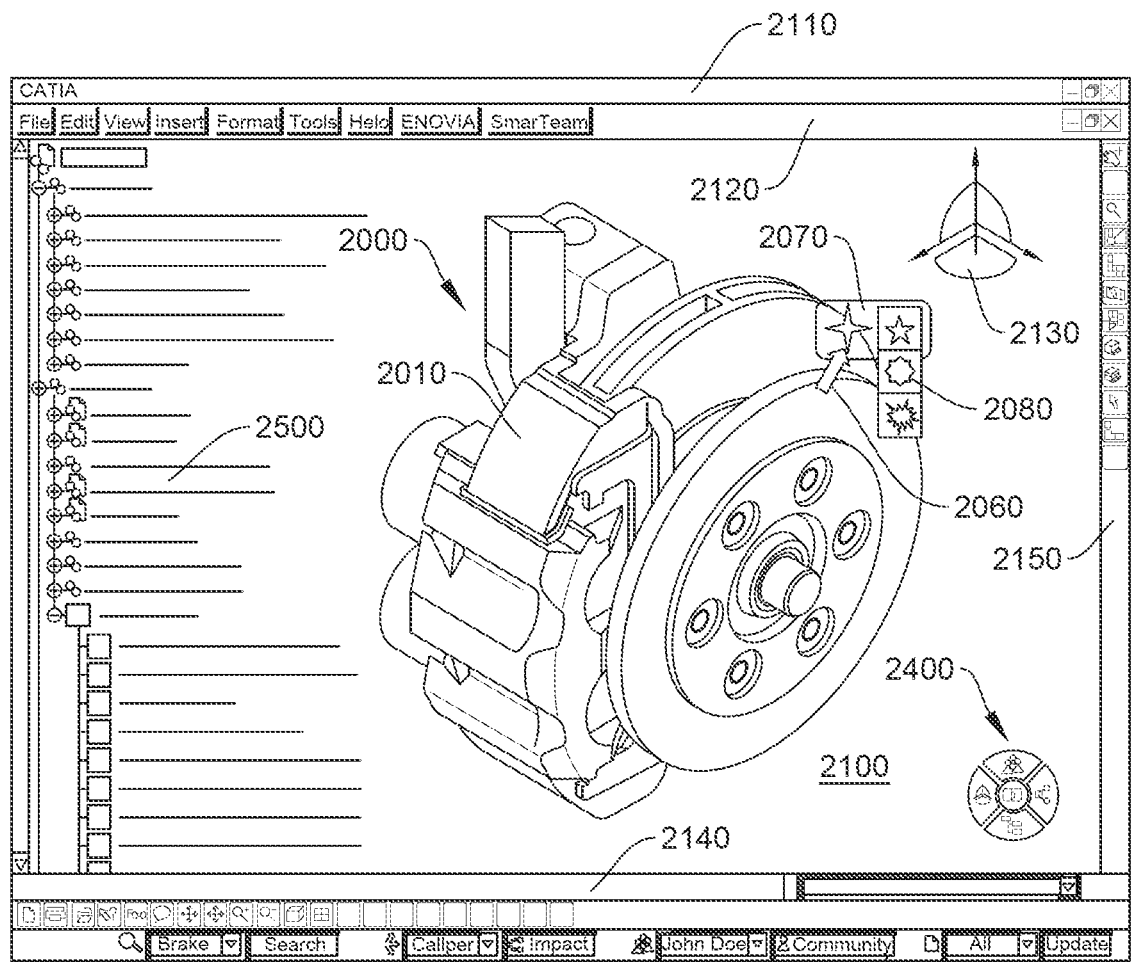
FIG. 2 shows an example of a graphical user interface of the system.

FIG. 2 shows an example of the GUI of any system herein, wherein the system is a CAD system.

The GUI 2100 may be a typical CAD-like interface, having standard menu bars 2110, 2120, as well as bottom and side toolbars 2140, 2150. Such menu- and toolbars contain a set of user-selectable icons, each icon being associated with one or more operations or functions, as known in the art. Some of these icons are associated with software tools, adapted for editing and/or working on the 3D modeled object 2000 displayed in the GUI 2100. The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g. change the dimension, color, etc.) or edit geometrical constraints by selecting an appropriate icon. For example, typical CAD operations are the modeling of the punching or the folding of the 3D modeled object displayed on the screen. The GUI may for example display data 2500 related to the displayed product 2000. In the example of the figure, the data 2500, displayed as a "feature tree", and their 3D representation 2000 pertain to a brake assembly including brake caliper and disc. The GUI may further show various types of graphic tools 2130, 2070, 2080 for example for facilitating 3D orientation of the object, for triggering a simulation of an operation of an edited product or render various attributes of the displayed product 2000. A cursor 2060 may be controlled by a haptic device to allow the user to interact with the graphic tools.

Aspects of the machine-learning method and the 3D design method are now discussed.

According to a first aspect, in the method of machine-learning, the provided architecture for the neural network is a Variational Auto-encoder (VAE) architecture. In such a case, the neural network is configured to take as an additional input a random variable. This forms an improved solution to output, from an input 2D sketch, a 3D model represented by the 2D sketch.

In specific, a variational autoencoder comprising an inputted random variable, improves the robustness of the learning method with respect to the inaccuracies in the input data of the neural network. Indeed, the input 2D sketch may not be precise (e.g., when the 2D sketch comprises gaps between the strokes or when the 2D sketch is freehand) and the feature of VAE improves the capability of the method to output a 3D model with imprecise input data.

According to the first aspect, in the method of 3D design, the learnt neural network according to the first aspect is applied to a 2D sketch and a random variable, to output a 3D model represented by the 2D sketch. This feature improves the ergonomics of the 3D design method as it improves the capability of the design method to output accurately a 3D model when the inputted 2D sketch has some impreciseness or is incomplete (e.g., when the user intends to compute the 3D model faster and/or when he/she is currently drawing).

Figure 3:
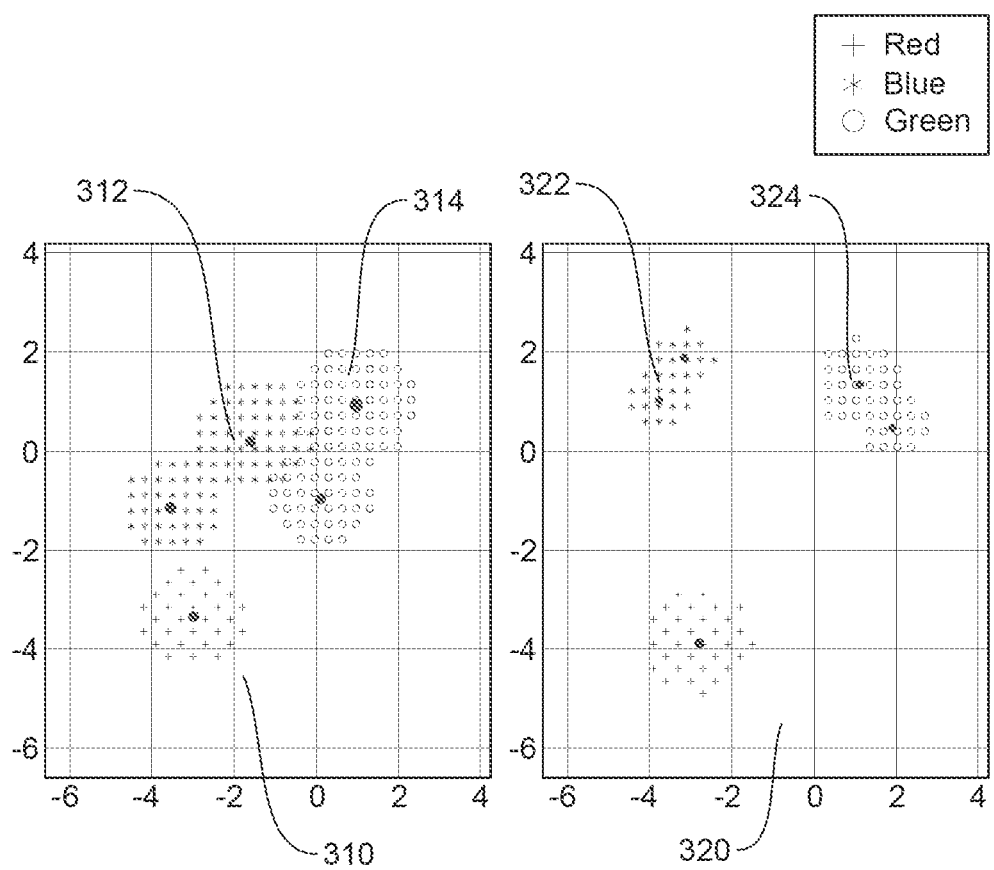
FIGS. 3, 4, 5A, 5B, 6, 7, 8, 9, 10, 11 and 12 illustrate the method.

Inputting a random variable in VAE also enables the method of 3D design according to the first aspect to output multiple 3D models from a single 2D sketch. Each outputted 3D model corresponds to one random variable. This forms an improved solution to output, from an input 2D sketch, a 3D model represented by the 2D sketch being selected by the user among the multiple 3D models proposed to the user. This is particularly efficient when the inputted 2D sketch has some impreciseness, is incomplete, or when the 2D sketch does not unambiguously represent one single 3D model. Referring to FIG. 3, a VAE allows to obtain a regularized latent space and to introduce randomness in the outputs. As mentioned before, a 2D rectangle can represent a 3D cylinder from a front view, or a 3D box from any canonical view, so the method may rather propose both a cylinder and a box. The figure shows an illustration of a regularized latent space 310, and a non-regularized latent space 320. More details about the regularization are provided later. One may observe that in the regularized latent space 310 color regions are closer to each other compared to the non-regularized latent space 320. Thus, picking a latent vector near the blue region 312 (representing cylinders for example) may give a latent vector in the green region 314 (representing boxes for example). In contrast, a latent vector near the blue region 322 may not give a latent vector in the green region 324. Thus, if the 2D sketch is un-certain, the VAE method may propose multiple different solutions, i.e., 3D models corresponding to different regions in the regularized latent space 310, for example, one 3D model corresponding to region 312 and another one corresponding to region 314.

According to a second aspect, the 3D model is a parameterized 3D model defined by a set of parameters. The set of parameters consists of a first subset of one or more parameters and a second subset of one or more parameters. According to the second aspect, in the method of machine-learning, the neural network is configured to selectively (1)

output a value for the set, and (2) take as input a value for the first subset from a user, and output a value for the second subset (in other words, the neural network may be used alternatively/selectively according to option (1) or to option (2)). This forms an improved solution to output, from an input 2D sketch, a 3D model represented by the 2D sketch.

A (e.g., fully) parameterized 3D model of a 2D sketch is easily editable by modifying a few numbers of parameters, unlike a fixed representation of the 3D model like mesh representation, voxel occupancy grid or point cloud. In examples, the number of parameters to parameterize the 3D model is lower than the number of faces of its tessellated mesh, the number of the occupied grids of its voxel grid, or the number of marked points in its point cloud by a factor higher than 5 (e.g., higher than 10). Each parameterized 3D model may be defined by a number of parameters lower than 100 (e.g., lower than 50). The parameterization feature thus represents the 3D model in a compact and organized manner. Also, as known from the field of CAD, acting on a single parameter may present a global impact, while in the case of a mesh or voxel grid or point cloud, acting on a single geometrical entity only presents a local impact. For example, any 3D model herein may be configured for scaling up its occupied volume by modifying a number of parameter values inferior to 5 (e.g., inferior to 3), as opposed to moving/increasing a high number of mesh triangles. In addition, a parameterized 3D model is semantically more meaningful to a user than a mesh or voxel grid or point cloud.

According to the second aspect, the user may selectively fix a part of data defining the outputted 3D model. Thus, the neural network can be efficiently learnt for outputting a specific type of 3D models being characterized in having a specific value for the first subset of one or more parameters. This improves the learning.

In examples, the 3D model may be parameterized by one or more shape parameters, for example including one or more positioning parameters (e.g., 3D coordinates) for one or more bounding points (e.g., the corner points when the 3D model is representing a prism). Shape parameters may additionally or alternatively include one or more lengths corresponding to one or more dimensions (e.g., the length of the edges for a cuboid and/or the height of a prism). Any 3D model herein may alternatively or additionally be defined by a type parameter (e.g., the type of the section when the 3D model represents a prism). Any 3D model herein may alternatively or additionally be defined by additional shape parameters depending on its type, optionally including one or more positioning parameters (e.g., 3D coordinates of the corner points of the section when the 3D model is representing a prism). Such parameterization of the 3D model is particularly ergonomic for a user to edit.

Hereinafter, the value for the set of parameters consists of a value for the first subset and a value for the second subset. The selective outputting of a value for the set means that the user may either select to output the value for the (whole) set of the parameters or to give as input the value for the first subset of parameters to the neural network. In the former case, the value for the first subset and the second subset are not inputted by the user but both computed (automatically) by the neural network. In this case, the 2D sketch may be the only input to the neural network and the outputted value for the first subset as well as the second subset are computed by the neural network. In the latter case, the inputted value of the first set of parameters of the 3D model may be used by the neural network to output the value for the second subset.

In examples, the first subset of one or more parameters may consist of one or more of the type parameters and the second subset of one or more parameters may consist of one or more of the shape parameters. Thus, the user can restrict output of the neural network to a certain type (e.g., the prism with triangular section), while leaving the neural network free to compute the shape.

According to the second aspect, in the method of 3D design, selectively, a value for the first subset of one or more parameters is provided, to output a value for the second subset of one or more parameters. Thus, a user is able to set part of the parameters defining the 3D model as the input of the model and obtain the remaining parameters. This feature improves the ergonomics of the 3D design method by permitting the user to output a 3D model of a certain category, i.e., with some predefined set of one or more parameters characterizing the category. In examples of the method of 3D design, the user may have already decided on the value for one or more parameters of the first subset or there are some practical constraints to choose them.

According to a third aspect, in the method of machine-learning, the 3D model is a parameterized 3D model defined by a set of parameters consisting of a section and an extrusion. This provides a simple and compact editable parameterization of the 3D model and forms an improved solution to output, from an input 2D sketch, a 3D model represented by the 2D sketch.

In examples, the set of parameters is common among different categories of 3D models, each category may be characterized by one or more parameters of the set of parameters. The machine-learning according to the third aspect learns a single network, the network is then used to generate several categories of 3D models. By single network, it is meant that a single set of operations and weight values of the neural network are learnt altogether for different categories of 3D models in the machine-learning method. In other words, the learning comprises a single minimization of a single loss, even if possibly mini-batch by mini-batch, e.g., a single stochastic gradient descent. Thus, the single network is different from a combination of several neural networks, where each may be learnt for one or more categories of 3D models, connected together by a selector for a respective category.

In examples, the section may be defined by a type parameter representing the geometric type of the section and one or more (e.g., two or more) shape parameters. The shape parameters may be a list of positional parameters. In examples, the extrusion may be defined by a line in the 3D space. In examples, the extrusion line may be a straight line or a curved line. The straight line may be perpendicular to the section; thus the extrusion may be represented by an extrusion length.

According to the third aspect, in the method of 3D design, the learnt neural network is applied to a 2D sketch, to output a value of a set of parameters consisting of a section and an extrusion. This feature improves the ergonomics of the 3D design method as it provides the user with a simple and compact editable parameterization of the 3D model.

The different aspects of the method may be combined together.

For example, the first aspect may be combined with the second aspect. In such a case, the 3D model is defined by a set of parameters consisting of a first subset of one or more parameters and a second subset of one or more parameters and the neural network has a VAE architecture. The neural network is configured to take as an additional input a random variable. The neural network is further configured to selectively output a value for the set and take as input a value for the first subset from a user and output a value for the second subset. This forms an improved solution to output, from an input 2D sketch, a 3D model represented by the 2D sketch.

Consequently, the method of 3D design is applied to a 2D sketch and a random variable, to output a 3D model represented by the 2D sketch and may selectively, a value for the first subset of one or more parameters is provided, to output a value for the second subset of one or more parameters. In such a selection, the VAE architecture of the neural network may become a conditional VAE based on the inputted value for the first subset. Such an architecture is known as a conditional variational autoencoder (CVAE).

As another example, the second aspect may be combined with the third aspect. In such a case, the 3D model is defined by section and an extrusion wherein the section and the extrusion are defined by a set of parameters consisting of a first subset of one or more parameters and a second subset of one or more parameters. The first subset may then consist of a number representing a type of the section. In examples, the number may represent the number of sides forming the section. Each side may be either a straight line (segment) or a curved line (arc). The second subset may comprise a parameter defining the extrusion and/or a parameter further defining the section.

As yet another example, the first aspect may be combined with the third aspect. In such a case, the 3D model is a parameterized 3D model defined by a set of parameters consisting of a section and an extrusion. The method of 3D design outputs one or more 3D models with possibly different types of sections.

Finally, the first aspect, the second aspect and the third aspect may be combined altogether. In such a case, the method of 3D design is applied to a 2D sketch and a random variable, to output a 3D model represented by the 2D sketch and selectively, the type of the section is provided, to output a value for the extrusion and/or a parameter further defining the section.

The first subset may then consist of a number representing a type of the section. In examples, the number may represent the number of sides forming the section. Each side may be either a straight line (segment) or a curved line (arc). The second subset may comprise a parameter defining the extrusion and/or a parameter further defining the section.

Examples of the dataset-forming method are now discussed.

In examples, the dataset-forming method may comprise generating a random value for one or more of the training samples. The generation of the random value corresponding to one or more of the training samples may be a part of the learning method, for example the random value may be generated "on the fly". The random value may be chosen according to a probability distribution (e.g., a normal distribution), possibly with predefined parameters (e.g., a standard normal distribution).

In examples, the 3D model may be a parameterized 3D model defined by a set of parameters consisting of a first subset of one or more parameters and a second subset of one or more parameters. The dataset-forming method may comprise providing initial data comprising a first discrete subset of one or more parameter domains corresponding to the first subset of one or more parameters, and a second discrete subset of one or more parameter domains corresponding to the second subset of one or more parameters. Synthetizing the 3D model may be performed based on such initial data based on a selection value of the first subset and/or the second subset in their respective parameter domain.

Any selection performed when synthetizing a 3D model may be performed via a (e.g., random) sampling. This allows generating data representing relatively well the diversity of real situations. This thus leads to an eventually accurate learning. Any (e.g., random) sampling may comprise a uniform (e.g., random) sampling within the set where the variable to be selected takes values (e.g., a random uniform sampling being a random sampling according to a uniform probability distribution). Alternatively, the sampling may comprise a random non-uniform sampling in which the probability of choosing some values are higher than others. Higher probabilities may be attributed to the values that appear more often in the applications of the 3D design method.

In particular examples, the dataset-forming method may comprise providing initial data comprising a section type from a discrete set of section types and, with the section type, the respective discrete set of one or more parameter domains for one or more shape parameter. Synthetizing the 3D model may be performed based on such initial data. In particular, the synthetizing of the dataset may include generating an integer representing the type of the section, and, generating, based on the number, the list of positional parameters and the value for the extrusion. Hence, the 3D model is fully defined.

In an efficient example of dataset-forming method according to the third aspect, the method may select a value for the type of the section (e.g., a value corresponding to a triangle), one or more values for the positional parameters for the selected type of section (e.g., the 3D coordinates of the triangular section corners), and a value for the extrusion length normal to the section. In some options of this example, the positional parameters of the section may correspond to the corners of the section and may be chosen on a unit circle. In other options of this example, the positional parameters of the section and the value for the extrusion length may be chosen to obtain the biggest 3D model corresponding to the set of these positional parameters and the extrusion fitting in the unit sphere. In particular, for the scaling, the bounding box of the 3D model is re-centered in the origin of the coordinate system ((0, 0, 0)). The 3D model is then rescaled, with a scaling ratio, in order to obtain the biggest 3D model fitting in the unit sphere. To rescale the model, we simply multiply the norm of each point of the 3D model with the scaling ratio. Such a scaling of the dataset improves the learning.

In examples, the dataset-forming method may populate the dataset with several 2D sketches from a single 3D model by applying a random rotation. In other example, alternatively the 3D model may remain fixed and the method may obtain several 2D sketches from a random viewing direction, represented by a vector from a selected point on the unit sphere to its center. In both examples, the 2D sketches may then be computed (e.g., projected) to a plane normal to the viewing direction. In examples, the computed 2D sketches may be rendered in black and white, wherein the rendered edges may be black (e.g., to a photo of size 256 pixels in 256 pixels), and inserted into the dataset. In examples, the colors of inserted 2D sketches are inverted to obtain a background in black, and lines in white. This maximizes the number of zero values in the inputted 2D sketch of the neural network. Thus, this improves the learning. The values of the rendered sketch may be rescaled from standard [0, 255] to [0, 1].

In examples, the method may add some random noise to the lines of the sketch. The method may add the noise to one or more parameters defining each line of the sketch and/or to the end points of each line. Such examples improve the robustness of the neural network learnt on such a dataset against the impreciseness of the inputted 2D sketch.

Examples of the learning method are now discussed.

The learning method forms an improved solution for CAD design. Notably, the learnt neural network is usable for converting a 2D sketch into a 3D model. In the context of CAD, this is particularly useful as already discussed. The learning may comprise a supervised training, based on at least part of the dataset. In such a case, said at least part of the dataset includes, for each 2D sketch, a respective 3D model forming with the 2D sketch a (labeled) training sample. Said at least part of the dataset may be provided according to any method, for example formed according to the dataset-forming method.

In particularly efficient examples, the learning method may comprise a supervised training based on the dataset formed by the dataset-forming method. As known from the field of machine-learning, each training may comprise iteratively processing a respective dataset, for example mini-batch-by-mini-batch and modifying weight values of the neural network along the iterative processing. This may be performed according to a stochastic gradient descent. The weight values may be initialized in any way for each training. The weight values may be initialized in any arbitrary manner, for example randomly or each to the zero value.

In examples, according to the first aspect of the machine-learning method, the neural network is configured to take as an input a 2D sketch and a random variable. The learning method may comprise a step of generating a value for the inputted random variable according to a probability distribution (e.g., $N(0, 1)$). The learning method may generate a random number "on the fly" in the learning process for each one of the training samples.

The learning may comprise minimizing a loss function, wherein the loss function represents a disparity between each of the 3D models of training samples set and the 3D model outputted by the neural network, from a respective 2D sketch of the training sample.

In examples, according to the second and third aspects of the machine-learning method the loss may penalize a disparity between the parameters defining the 3D model of each of training samples and the respective parameters computed by the neural network. In a particularly accurate example, according to the third aspect of the machine-learning method, the disparity may comprise a mean-squared error between the positional parameters (e.g., coordinates of the points) defining the section of the 3D model of each of training samples and their respective predicted values and/or a mean-squared error between the extrusion parameter (e.g., extrusion length) of the 3D model of each of training samples and its respective predicted values. In another particularly accurate example, according to the third aspect of the machine-learning method, the disparity may comprise a metric of a difference between the type of section of 3D model of each of training samples and the type, or the probability value of each type, computed by the method.

In examples, according to the first aspect of the machine-learning method, the neural network, the loss function may comprise a regularization loss with a term to penalize the disparity between the probability distribution of the random variable ($\varepsilon$) (e.g., $N(0, 1)$) and the probability distribution defined by the mean ($\mu$) and the standard deviation ($\delta$) (e.g., $N(\mu, \delta)$). The learning method may initialize the value for the mean and the standard deviation at the beginning of the learning. The learning method may compute the value for the mean and the standard deviation during the process of the learning. The loss function may measure the disparity using different distances and/or divergences between the two probability distributions. In a particularly efficient example, the disparity between the said probability distributions is a Kullback-Leibler divergence loss.

Back to FIG. 3, one may observe the regularization effect of the Kullback-Leibler divergence loss. In the non-regularized latent space 320, the different regions, corresponding to different computed means and/or standard deviations, may be completely separated. Thus, the method according the first aspect may lose the possibility to propose a 3D model from other regions than the region with the minimum reconstruction loss. The reconstruction loss may represent the errors in the produced 3D model, e.g., the parameters defining the 3D model. Including Kullback-Leibler divergence loss in the objective function may enforce the neural network to consider the counterbalance between a reconstruction loss, and randomness in the input data. Further, including Kullback-Leibler divergence loss in the objective function encourages the predicted mean to regroup around zero, and the standard deviation to be around 1. These effects may lead to bringing the different regions closer to each other in the regularized latent space 310.

The first aspect of the method is now discussed.

According to the first aspect, the neural network may comprise a first part and a second part. The first part may be configured to take the 2D sketch and the random variable as inputs and to provide a respective output. The second part may be configured to take the respective output of the first part as input and to output the 3D model. Herein, a part of a neural network means a virtual grouping of the architecture and corresponding weights of the neural network.

Being configured to take the random variable as input in the first part which comprises an encoder may form an improved solution to output compared to the introduction of the random variable before a decoding stage by one or more decoders. This is because it keeps the consistency of the inputted sketch in decoding stage as all the decoders decode the same latent vector. Also, this fixes the final latent vector that will be decoded in every decoder.

The first part may comprise a first subpart and a second subpart. The first subpart may be configured to take the 2D sketch as input and to output a first latent vector. The second subpart may be configured to take the first latent vector and the random variable $\varepsilon$, and to re-parameterize the first latent vector into a second latent vector with the random variable. A latent vector means a block of data of the neural network which serves as an intermediate result in the process of computing the output of the neural network from the respective input. The latent vector may not be accessible or outputted directly. In a particularly efficient example of the first aspect, the first subpart may be a convolutional neural network (CNN).

The second subpart may be configured to compute a "conditional mean" $\mu$, and a "conditional standard deviation" $\delta$, of the second latent vector. Conditional mean and conditional standard deviation mean respectively, a vector for the mean and a vector for the standard deviation. Herein the re-parameterization means doing the so-called "re-parameterization trick", wherein the output of the second subpart, i.e., the second latent vector may be computed by randomly sampling according to the following formula:

$$\text{output} = \mu + \delta * \varepsilon$$

where output denotes the second latent vector. Thus, any of the elements of the standard deviation may be multiplied by a random variable as an offset and may be added to the mean to obtain the second latent vector. Such a formula for obtaining the second latent vector is differentiable with respect to $\mu$ and $\delta$. This differentiability makes it possible to train the neural network, e.g., with a gradient descent method.

According to this first aspect, the random variable, $\varepsilon$ may follow a probability distribution according to a law, (N(.,.)) defined by a mean and a standard deviation, the random variable having a respective value (e.g., 0) for the mean and a respective value (e.g., 1) for the standard deviation. In examples, the law may be a law of the normal distribution. In an ideally-learnt neural network, i.e., when there is no error in the respective learnt weights of the neural network, the conditional mean and conditional standard deviation should represent the same distribution as of the random variable $\varepsilon$, in examples, $N(\mu, \delta)=N(0, 1)$. Thus, according to this first aspect, the learning may comprise optimizing an objective function which comprises a loss between these two probability distributions. Comprising such a loss term has a regularizing effect in optimizing the objective function as it helps to regularize the latent space. This regularizing effect may be compared to the effect of "$L_2$-regularization" loss widely used in machine learning area to penalize the large weights of a network. In order to avoid all the regularized weights from becoming zero, the relevant coefficient of the loss terms with regularizing effect may be chosen relatively small. The examples of learning according to this aspect will be discussed later.

The second aspect of the method is now discussed.

According to the second aspect, the architecture may comprise a piece of data. The neural network may be configured, for selective outputting a value for the set, to produce a first value for the piece of data, to determine the value for the first subset based on said first value for the piece of data, and to further determine the value for the second subset based on said first value for the piece of data. The neural network may be configured, for selective taking as input the value for the first subset from the user and outputting the value of the second subset, to produce a second value for the piece of data based on the value for the first subset, to output the value for the second subset based on the second value for the piece of data.

A piece of data may represent a block of data in the neural network, or one or more layers of the neural network comprising one or more operations and/or one or more blocks of data. The first value and the second value for the piece of data represents how the block of data is populated: the neural network may automatically populate the first value for the piece of data by the computation during its execution; the second value is populated via a user-interaction independently of execution of the neural network.

Further, according to the second aspect, the neural network may comprise an operation, i.e., a function. The function may be predetermined, e.g., constant and during the execution of the neural network. For selective outputting a value for the set, wherein the value for the first subset is produced based on said first value, the value for the first subset corresponds to an image of the function of the first value for the piece of data. For selective taking as input the value for the first subset from the user and outputting the value of the second subset, the second value is a preimage of the value for the first subset according to the function. As, in general, there may be more than one preimage of the value according to the function, the second value is selected as one of the admissible preimages according to a criterion. The criterion may be to choose the preimage with the largest vector infinity-norm. Thus, the function (e.g., an argmax function, as described later) may be used at inference time in order to convert the inputted value from the user for the first subset to the second value. The second value is used by the neural network to compute the second subset.

According to second aspect, the piece of data may be a vector representing a probability distribution for the first subset, and the function may be the argmax function. Further, the second value of the piece of data may be a vector having a value of 1 for coordinates corresponding to the value for the first subset, and a value of 0 for all other coordinates.

In examples of method of 3D design according to the second aspect, prior to the user providing the value for the first subset the neural network may be applied to the 2D sketch, to output one or more respective values each for the set and one or more 3D models may be displayed to the user. The user may provide the value for the first subset while the one or more 3D models are displayed.

The third aspect of the method is now discussed.

In this aspect, the 3D model is a parameterized model defined by extruding, i.e., sweeping the section along the extrusion line. The geometric type of the section is represented by a number. The neural network being further configured to output a vector representing a probability distribution for the number.

The section may be 2D, i.e., planar, and consists of two or more sides, each side being either a straight line (segment) or a curved line (arc). The representing number of the type of the section, thus, may represent a number of the sides (segments or arcs) forming the section (nbSides). The curved lines may be represented in various manners, e.g., spline or non-uniform rational B-splines (NURBS).

The section may be further defined by a list of positional parameters. The number of positional parameters may be equal to the number of the sides of the section. Each positional parameter may optionally comprise one couple of 3D points. Alternatively, one or more positional parameters may comprise one single 3D point. The section may be fully defined by the number representing the geometric type of the section and the list of positional parameters. The section may be further defined by a flag associated to each predicted couple of points to represent if the respective side is a segment or an arc.

According to this aspect, the architecture of the neural network may comprise a recurrent neural network (RNN) being configured to output a value for the list. The RNN is very efficient in computing the values of the sequential list, as any of the elements of the list may be computed in relation to the already computed elements of the list.

The RNN may comprise one or more long short-term memory (LSTM) cells. The number of LSTM cells may be equal to the number of elements of the list. Alternatively, the architecture may be static and the number of LSTM cells may be fixed for different types of sections. The number of LSTM cells may be equal to the largest number of positional parameters required to define different types of sections. Having a static architecture may improve the training's computing time. Each LSTM cell may be attributed to one of the elements of the list and be configured to output the value of that element. In examples, RNN may be replaced by fully connected (FC) layers.

The neural network may be further configured to output a value for the extrusion based on a final state of the RNN. The extrusion line may be represented by a straight line or a curved line. The curved line may be represented in various manners, e.g., spline or non-uniform rational B-splines (NURBS). In examples, the curved line may be defined by a second list of positional parameters; each positional parameter optionally comprising one couple of 3D points. The neural network may comprise a second RNN being configured to output a value for the second list. In examples, the line of extrusion may be a straight line normal to the section, thus it may be represented by a scalar parameter of extrusion length (h). In examples, each positional parameter is either one or a couple of 3D points representing the points residing on the boundary of the section.

In an example of this aspect, the 3D model is either a cylinder or a prism with an extrusion orthogonal to the section.

The combination of the different aspects is now discussed.

In examples, the method of machine-learning according to the first aspect and the second aspect may be combined. Such a combination may comprise a neural network comprising two parts. A first part which may be configured to take the 2D sketch and the random variable as inputs and to provide as output a respective latent vector, and a second part which may be configured to take the respective latent vector of the first part as input. The first part may be the same as the first part according to the first aspect. The latent vector may be the same as the second latent vector according to the first aspect. The second part may comprise a first subpart which is configured to output the vector representing the probability distribution, and a second subpart which is configured to take as input a concatenation of the respective latent vector and the vector representing the probability distribution, and to output the second subset. The first subpart may be fully connected (FC) layer. According to the features of the second aspect, the first subpart may optionally take as input a value for the first subset from a user. In examples, the neural network may be configured to produce a second value for the vector having a value of 1 for coordinates corresponding to the value for the first subset and a value of 0 for all other coordinates.

In examples, the method of machine-learning according to the first aspect and the third aspect may be combined. In such examples, there may be a part of the neural network which is configured to take as input the vector concatenating the final state of the RNN and at least a vector representing the probability distribution and to output a value for the extrusion. In examples, the vector representing the probability distribution is the second latent vector. The part may be an FC layer.

In the combination of the second aspect with the third aspect, the first subset of one or more parameters may consist of the number representing the type of the section. This number may be attributed to the application of the argmax function to the vector of probability distribution of the piece of data. Further, the preimage of the value according to the function is chosen such that it is consistent with the vector having a value of 1 for coordinates corresponding to the value for the number representing the type, and a value of 0 for all other coordinates. Further, the second subset may comprise the parameter defining the extrusion and/or the list of positional parameters which further define the section.

Figure 4:
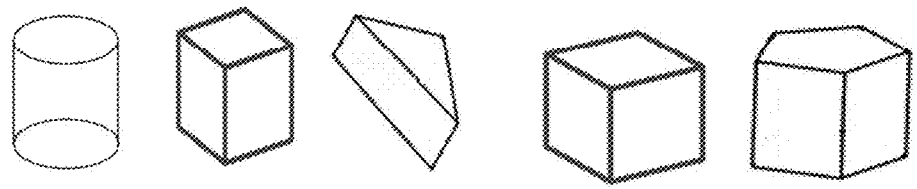

Implementations of the methods are now discussed with reference to FIGS. 4-12. These implementations are focused on the reconstruction of simple and parametric 3D primitives: parameterized cylinders, boxes, and regular prisms. FIG. 4 illustrates examples of such primitives. The 3D model of any of the 3D primitives is represented by a sweep representation such that each 3D model may be defined by a 3D planar section and a 3D straight extrusion line normal to the section.

Possible variations of these implementations may allow to cover more complex 3D shapes represented by a sweep representation. In these 3D shapes, the section may be non-regular and/or a combination of segments and arcs and/or the extrusion line may be a curve represented by a spline, i.e., a set of 3D points.

To predict the 3D model from the user 2D sketch, the implementations of the methods use a neural network deep learning algorithm. The algorithm allows to generate multiple parameterized 3D models from a single 2D sketch. The neural network can also take user feedback in input, to constraint the type of the predicted model.

In these implementations, the neural network is a vanilla model and returns one single 3D model from a 2D sketch. But variations may allow returning several 3D models from a 2D sketch, for example, if the neural network comprises an input parameter representing a number of 3D models to be outputted.

In these implementations, the neural network is a VAE model and is configured to take as an input one or more random variables to produce one or more propositions from a single input of 2D sketch. Each inputted random variable corresponds to each proposed 3D model. The random variables are sampled from a standard Gaussian distribution $N(0, 1)$.

In an option of these implementations, the neural network is in specific a CVAE model and comprises a condition variable to impose the type of the 3D model. The CVAE model returns one or more 3D models of the desired imposed type, from a 2D sketch. In other words, the neural network may be either used as a VAE or a CVAE.

In these implementations, each 3D model may be fully described by:

A number of sides (nbSides) corresponding to the number of points defining the section. It can be also seen as the type of primitive. In the example, the maximum number of sides is restricted to be 5. Further, the number of sides 2 to 5 is attributed to cylinder, triangle prism, box or cube, and pentagonal prism, respectively.

A set of 3D points (points) as a list of at most 5 couples of 3D points defining the points of the section. For example:

points=$[\{(X_1,Y_1,Z_1), (X'_1,Y'_1,Z'_1)\}, \ldots, \{(X_5,Y_5,Z_5), (X'_5,Y'_5,Z'_5)\}]$ In the example, a couple of two points is used to describe the curved sides of the section, e.g., the cylinder. The notations points[i][0] and points[i][1] are used for the first and second elements in each couple of 3D points.

A flag associated to each couple of points to represent if the respective side is a segment or an arc. The flag being equal to 0 represents a segment and the flag being equal to 1 represents an arc. The flag for all couple of points of a cylinder is 1, and for all couple of points of a box and a regular prism is 0.

Figure 5A:
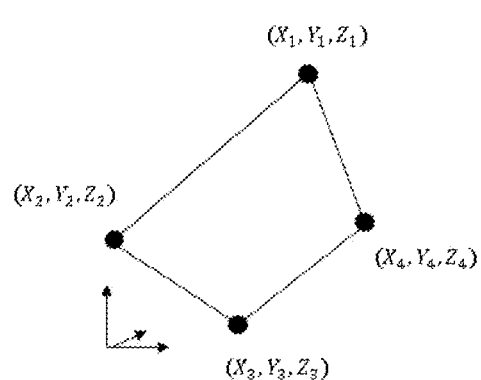
Figure 5A:
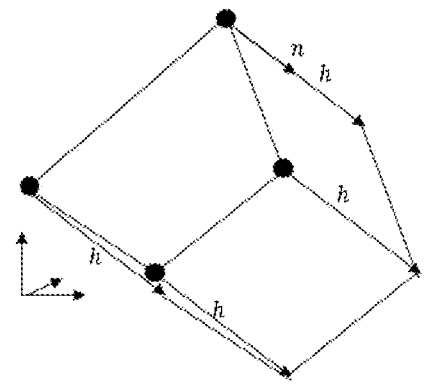
Figure 5B:
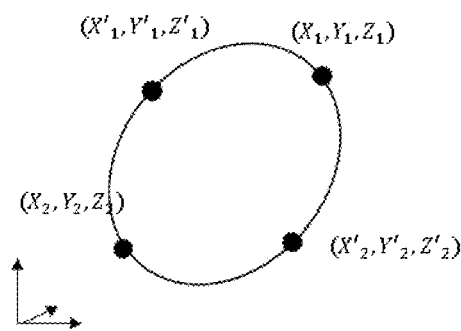
Figure 5B:
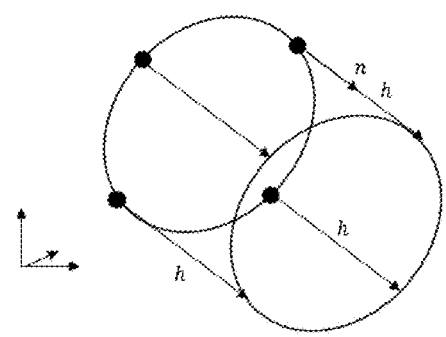

The construction of the 3D model is explained in reference to FIG. 5A and FIG. 5B.

First, the points defining the section, i.e., points[i] for i in [0, nbSides[ are considered in a 3D space. In general, it may happen that these points do not reside in the same 2D plane; thus, the mean plane of the points is computed. A mean plane corresponding to a set of points means a plane which minimizes the sum of its distance to each of the points. The mean plane may be computed by any known methods in the art. These points are sorted in an ascending order of an angle. The attributed angle to each points[i] may be defined on the mean plane as the angle between the segment connecting points[i] and a reference point on a mean plane and a reference line which lies on the mean plane and passes the reference point. Each of the points is orthogonally projected to this plane. Each of the projected points may be presented by the same notation as the original point, points[i]. Then, if the corresponding flag of points[i] represents a segment, i.e., equals 0, a closed planar section is obtained by drawing a line between each of the points[i][0] and points[(i+1)% nbSides][0] for i in [0,nbSides[. The notation a % b for two integer numbers a and b when b is non-zero represents the remaining of the division of number a to b. If the corresponding flag of points[i] represents an arc, i.e., equals 1 a curved line is drawn between each of the points[i][0] and points[(i+1)% nbSides][0] such that is passes through points [i][1] for i in [0,nbSides[. The resulting curve for the section is a circle or an ellipse. Further, the extrusion is computed with the extrusion length (h) in the normal direction to the mean plane (n).

Figure 6:
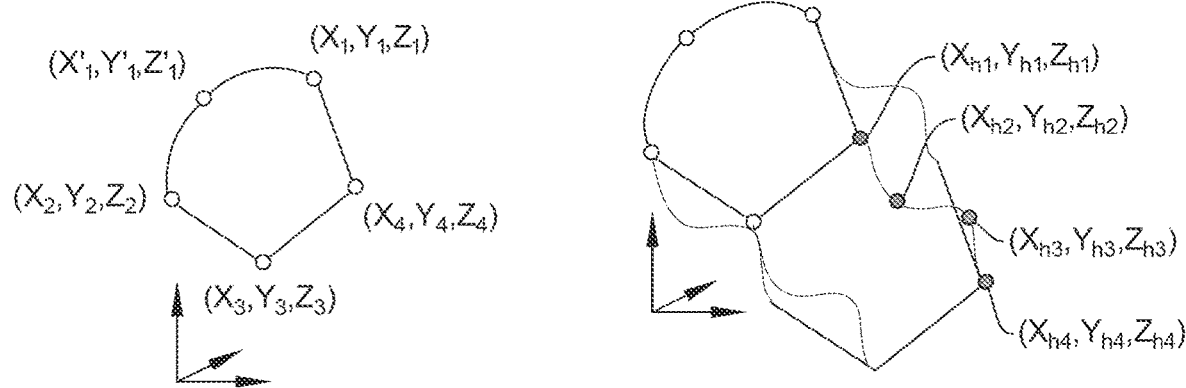

In reference to FIG. 6, a variation of these implementations is discussed in which a section extruded along a curved extrusion line. The section comprises both arc and segments and is represented by a list of four positional parameters [{($X_1$, $Y_1$, $Z_1$), ($X'_1$, $Y'_1$, $Z'_1$)}, ($X_2$, $Y_2$, $Z_2$), ($X_3$, $Y_3$, $Z_3$), ($X_4$, $Y_4$, $Z_4$)] of which the first positional parameter consists of a couple of parameters, each parameter of the list represents the Cartesian coordinates of a point of the boundary of the section in 3D. The extrusion line is represented by a spline, of a degree optionally less than 3, defined by a list of parameters [($X_{h,1}$, $Y_{h,1}$, $Z_{h,1}$), ($X_{h,2}$, $Y_{h,2}$, $Z_{h,2}$), ($X_{h,3}$, $Y_{h,3}$, $Z_{h,3}$), ($X_{h,4}$, $Y_{h,4}$, $Z_{h,4}$)].

In another variation of these implementation, one may generalize the flag to take integer values between 0 and n larger than 1. Each value of the flag indicates either a segment or a type of curved lines (e.g., arc, spline or NURBS).

From the examples, it is clear that the set of parameters nbSides, points and h are enough to parameterize and build a 3D model of 3D primitives.

Figure 7:
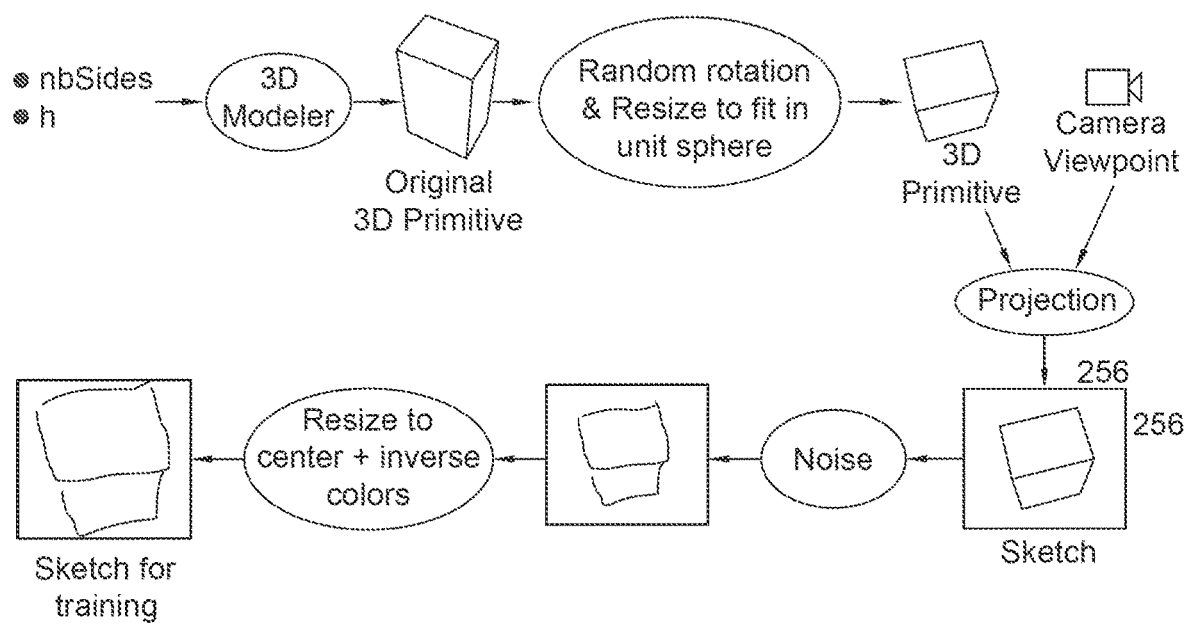

The example of the dataset-forming for this particular choice of parameters is now discussed in reference to FIG. 7.

In the example dataset-forming method, a random sampling is done on the number of sides of the section and nbSides is sampled according to the uniform probability distribution from the integers in the interval [2, 5]. In a variation of this example, nbSides is sampled according to a non-uniform probability distribution from the integers in the interval [2, 5]. The non-uniform probability distribution has larger values for a cylinder (nbSides=2) and a box (nbSides=4) compared to other values for nbSides, as cylinders and boxes appears more often in practical 3D designs. A uniform sampling is done for the extrusion length (h) on the between a maximum and minimum value of the interval [$h_{min}$, $h_{max}$] The value $h_{min}$ and $h_{max}$ are set by the user or set to a default automatically by the dataset-forming method, e.g., to 1 and 10, respectively. Further, the parameter points is computed to obtain a regular section for the prisms when nbSides=3 or 5, for example by choosing nbSides number of points on a circle at a uniform distance. The chosen points are then sorted in an ascending order of their corresponding angles in the polar coordinate system. For boxes, nbSides=4, after obtaining a regular section as for other prisms, a new random parameter (r) is sampled uniformly, corresponding to the length ratio between the two sides, between a maximum and minimum value of the interval [$r_{min}$, $r_{max}$]. The value $r_{min}$ and $r_{max}$ are set by the user or set to a default automatically by the dataset-forming method, e.g., to 1 and 10, respectively. In an option of the dataset-forming method, the method generates a non-regular section for the 3D model when nbSides=3, 4 or 5, for example by choosing nbSides number of points inside a unit disc. The chosen points are then sorted in an ascending order of their corresponding angles in the polar coordinate system.

A primitive 3D model is sampled from the cross product of the mentioned sampling. After a random rotation with respect to the origin is applied to the primitive 3D model to mimic a random viewpoint. In the example the random rotation is applied with respect to the X and Z axes and its value is uniformly sampled from the interval [10°, 80°] for the X-axis and [0°, 180°] for the Z-axis. Then the primitive 3D model is rescaled by choosing a rescaling parameter and scaling the 3D model in all direction such that it fits inside unit sphere. This step improves the learning. Then, the 3D model is project from a fixed viewpoint on a 2D plane to obtain a photo of size 256*256 of the model. A random noise is applied to the lines of the sketch and some randomly chosen vertices is moved in a random or pre-defined direction by a random or pre-defined value. This step improves the 3D design method being applied to imprecise inputted 2D sketch.

Then the bounding square of the resulting sketch is computed and is resized to 256*256. This sketch is black and white while the rendered edges are in black. The colors of the image are inverted to obtain a background in black, and lines in white. This step increases the number of zero values in the inputted 2D sketch of the neural network and improves the learning. The values of the rendered sketch may be rescaled from the standard interval [0, 255] to [0, 1].

The training of the neural network in the example is performed on the part of the dataset formed by the discussed dataset-forming method. In examples, the 3D model may be one of the primitives and the training of the neural network may comprise a supervised training which includes minimizing a loss (L). The loss may penalize a summation of one or more of the following terms:

an extrusion loss with a term of the type $$\frac{1}{N}\sum_{n=1}^{N}\|h_n - \hat{h}_n\|^2$$

representing the disparity of the predicted extrusion height and the extrusion height of the 3D models. Here, $h_n$ designates said respective extrusion length and $\hat{h}_n$ designates the respective predicted $h_n$.

a point loss with a term of the type $$\lambda_1 \frac{1}{N}\sum_{n=1}^{N} \min_{s\in[0,nbSides_n-1]}\left(\sum_{i=0}^{nbSides_n-1}\|\hat{p}_{n,i} - \text{SHIFT}_s(p_{n,i})\|^2\right)$$

representing the disparity of the predicted coordinates of the points of the section of a 3D model and their corresponding predicted values. Here, i designates the said point and each $p_{n,i}$ designates said respective coordinates of the ground truth point[i][0] or point[i][1] of respective 3D model n and $\hat{p}_{n,i}$ designates the respective predicted $p_{n,i}$. Further, SHIFT$_s$(array) designates a function to shift each element of array to the right s times. This function allows not penalizing a circular permutation of the predicted set of points.

a number of sides loss with a term of the type $$\lambda_2 \frac{1}{N} \sum_{1}^{N} \sum_{k=0}^{5} (nbSides_n == k) \log(\widehat{s_n(k)})$$

representing the disparity of the type of the 3D models predicted coordinates of the points of the section of a 3D model and their corresponding predicted values. Here, $nbSides_n$ is the nbSides ground truth for the nth example. Further, $\widehat{s_n(k)}$ designates the predicted probability that respective 3D model is of type k. Further, $nbSides_n==k$ designates a function which gives 1 when k is equal $nbSides_n$ and 0 otherwise.

a Kaulback-Leibler divergence loss with a term of the type $$-\lambda_3 \frac{1}{N} \sum_{n=1}^{N} \frac{1}{2}(1 + \log(\widehat{\delta_n}) - \widehat{\mu_n}^2 - \widehat{\delta_n}^2)$$

representing the disparity of the normal probability distribution defined by $\widehat{\mu_n}$ and $\widehat{\delta_n}$ as $N(\widehat{\mu_n}, \widehat{\delta_n})$ and the standard normal distribution $N(0,1)$. Here, $\widehat{\mu_n}$ designates the predicted conditional mean and $\widehat{\delta_n}$ designates the predicted conditional standard deviation.

Here N designates the number of training samples and n refers to each of the 3D models of training samples. Further, $\lambda_1, \lambda_2, \lambda_3$ designate the weights which are needed to set to balance between variability and target reconstruction reliability. Choosing $\lambda_3$ large (compared to $\lambda_1$ and $\lambda_2$) privileges the variability of the generated 3D models and authorizes larger prediction error in terms of loss errors in number of sides, points and extrusion error. In an example, $(\lambda_1, \lambda_2, \lambda_3)$ may be set as (4.0, 1.0, 001).

Figure 8:
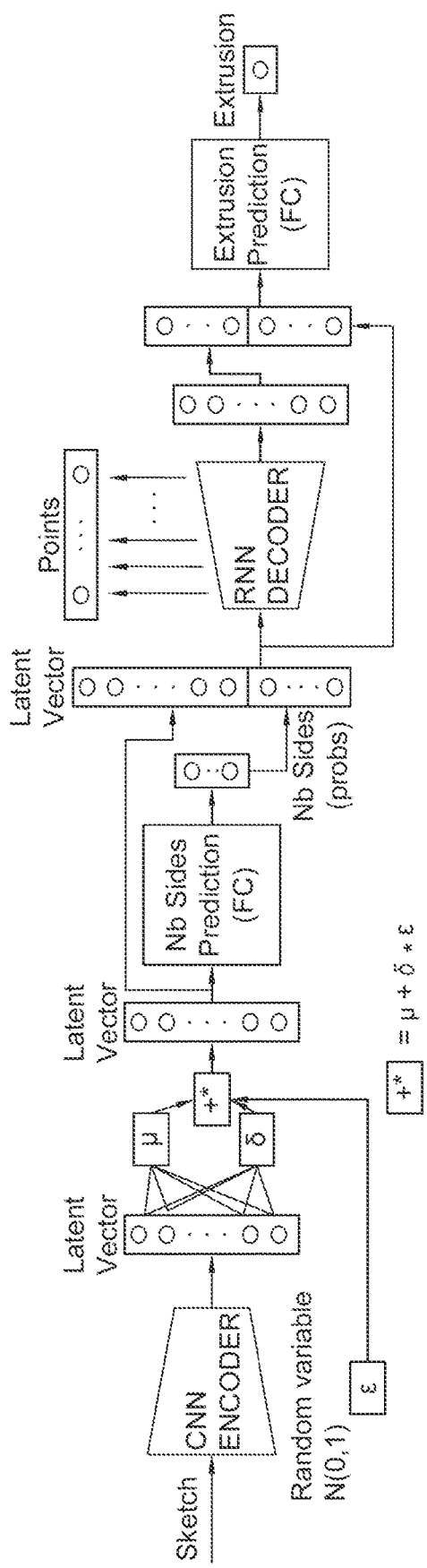

An example of machine-learning using the VAE architecture is now discussed in reference to FIG. 8. A 2D sketch and a random variable are inputted to the neural network and the set of parameters comprising three subsets of parameters is outputted: the list of points, the extrusion length, and a vector of probabilities for the predicted number of sides. The inputted sketch is processed by a CNN encoder to produce the first latent vector. The first latent vector is transformed into the second latent vector via the reparameterization trick by the mean and standard deviation and the inputted random variable. The notation +* for the operator stands for the operation output=μ+δ*ε. An FC layer is used to output the vector probabilities for the predicted number of sides. The vector of probabilities for the predicted number of sides is concatenated with the second latent vector to be inputted into an RNN decoder in which each LSTM cell predicts one couple of points. The final state of the RNN decoder is used in concatenation to the inputted vector to the RNN decoder to output the extrusion length using an FC layer.

Figure 9:
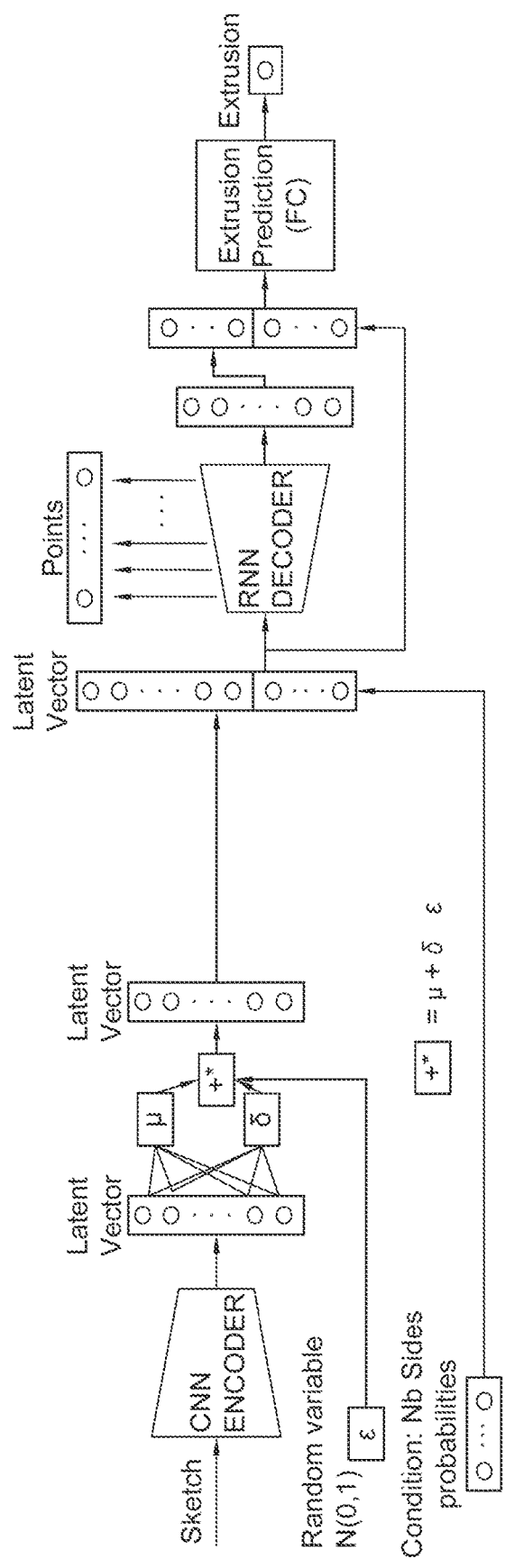

An example of the machine-learning method combining the first and second aspects (i.e., using the CVAE architecture) is now discussed in reference to FIG. 9. Compared to the discussed VAE architecture, the prediction layer of the nbSides has been removed. In the example, the vector of probabilities is created based on a choice of the user. For example, being a cylinder is attributed to the third coordinates in the vector of probabilities; thus, to impose a cylinder, the input may be [0., 0., 1., 0., 0., 0.]. This input is consistent with the vector predicted in the VAE architecture.

In the example, the CVAE architecture is not trained separately and the same learned weights from the VAE architecture are used.

In examples of the machine-learning method related to the variation of the implementations, the neural network may compute a set of points which define the spline of the extrusion line using a second RNN. The neural network may predict a flag for each couple of points defining the section referring to either being part of a segment or part of an arc. Further, instead of predicting a nbSides probabilities vector, the neural network may predict a STOP flag associated with each predicted couple of points. The flag represents a probability that the associated couple of points is the last couple of points defining the section. The nbSides may be determined by the occurrence of the first STOP flag with probability>0.5.

Figure 10:
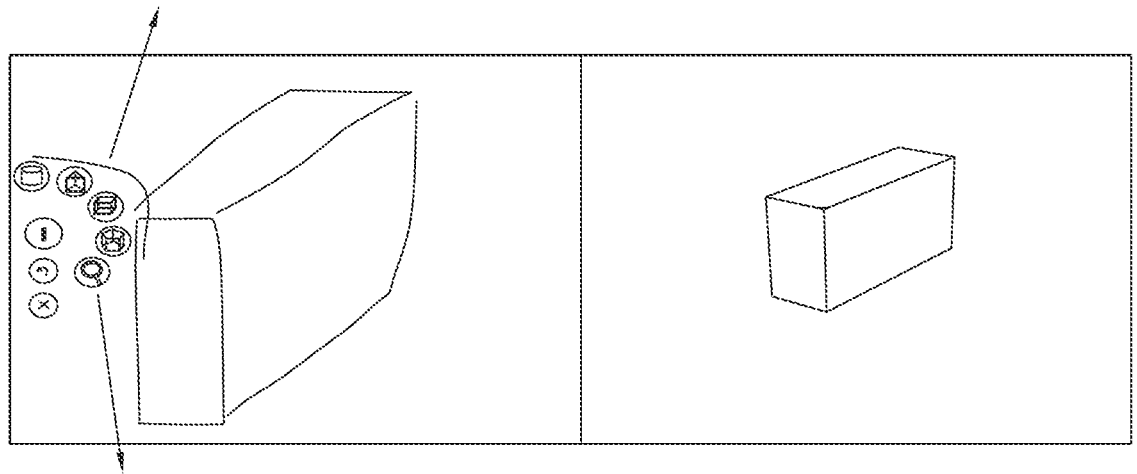
Figure 10:
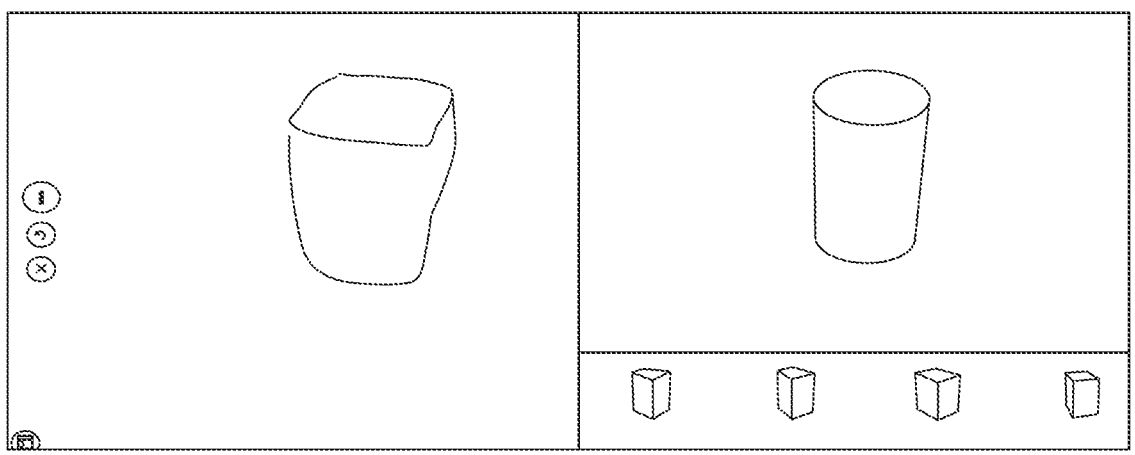
Figure 10:
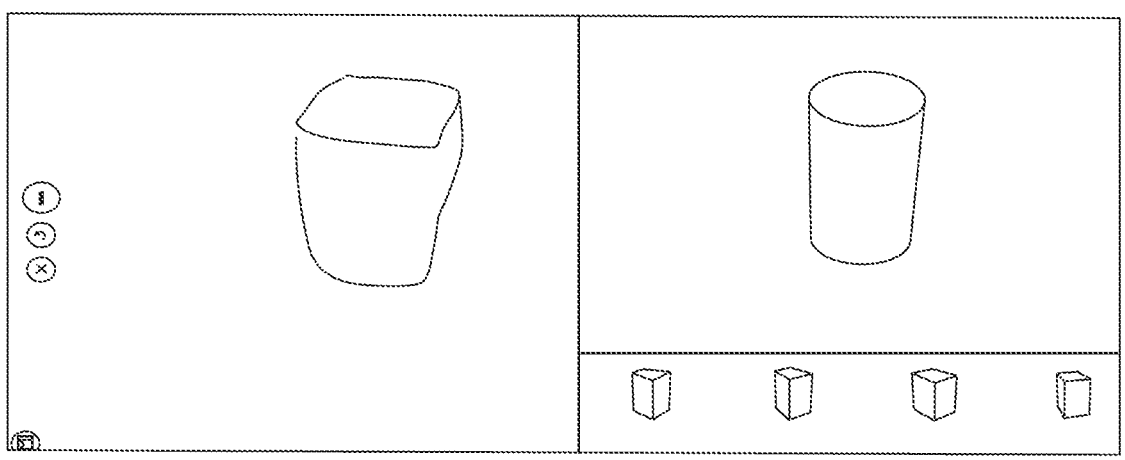
Figure 11:
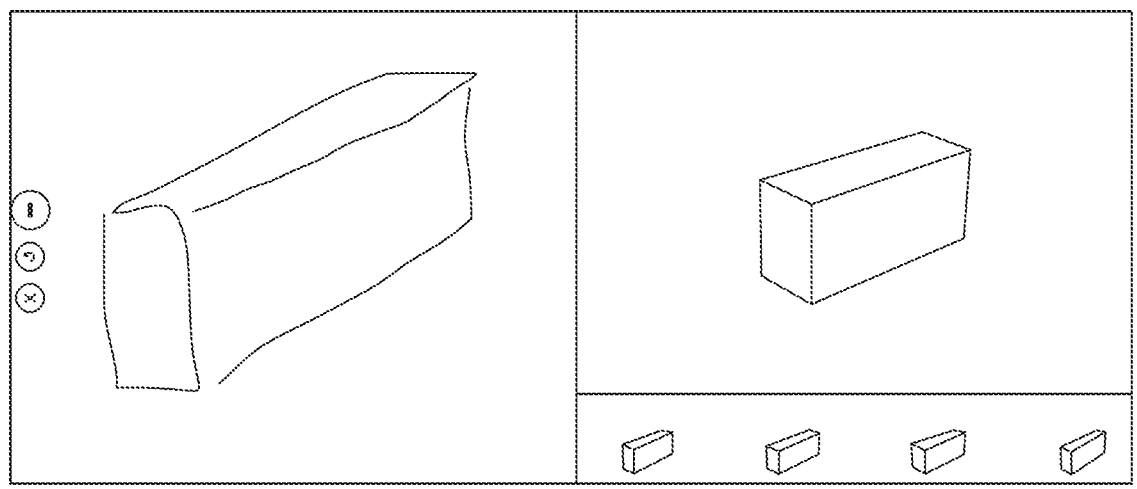
Figure 11:
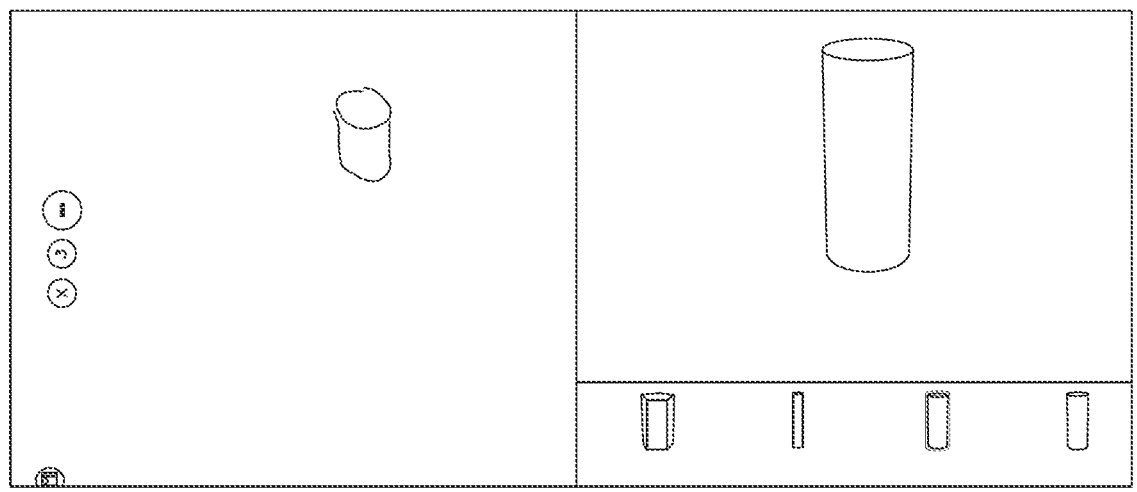

An example of the 3D design method is discussed in reference to FIG. 10. A 2D sketch is provided by the user using a haptic device without inputting a random variable. The method computes the bounding square and resizes it to 256*256. The colors of the sketch are inverted to obtain a white drawing and a black background. Further, the values of the sketch are rescaled from [0, 255] to [0, 1]. Several most probable 3D models are consequently computed and graphically presented to the user using the vanilla architecture. The user may select one of the provided models according to her/his design intent. If the user prefers to generate variations in the proposed 3D model for the intended design purpose, he/she may generate a new 3D model from the same sketch and a random variable automatically sampled from the distribution N(0, 1), using the VAE architecture. To increase the variation in the proposed 3D model, the user may increase the standard deviation of the distribution and the random variable may be sampled from the distribution N(0, 2). The user may also impose the type of the 3D model being a box and generate a new 3D model of the imposed type, given the same sketch and an automatically sampled random variable.

The user may also generate a new 3D model by imposing the type of the 3D model, given the same sketch, and optionally a random variable. This is discussed in reference to FIG. 11. The user may impose the cylinder type of the cuboid type either by entering their corresponding NbSides in an input window in the GUI or by selecting the intended type in GUI via a haptic device. Several most probable 3D models of the imposed type are consequently computed and graphically presented to the user using the CVAE architecture.

Figure 12:
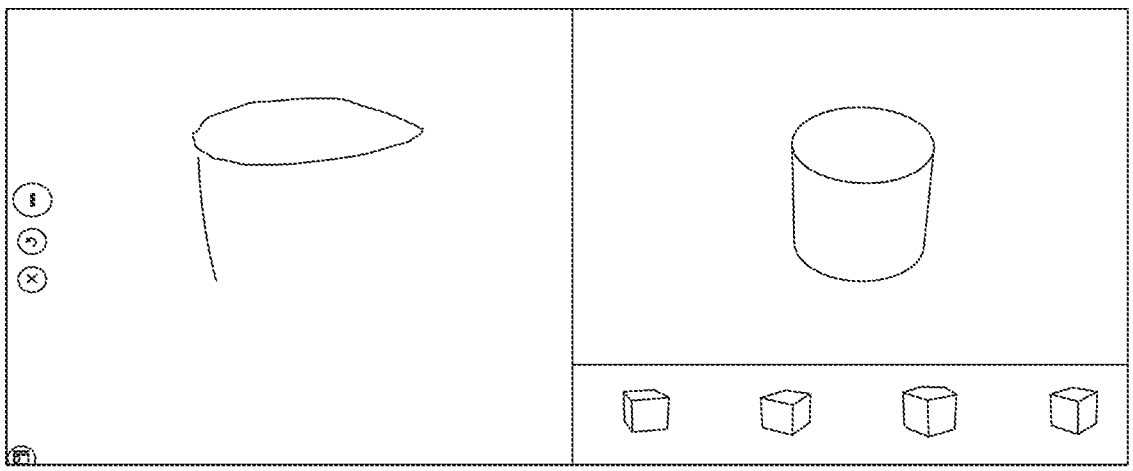
Figure 12:
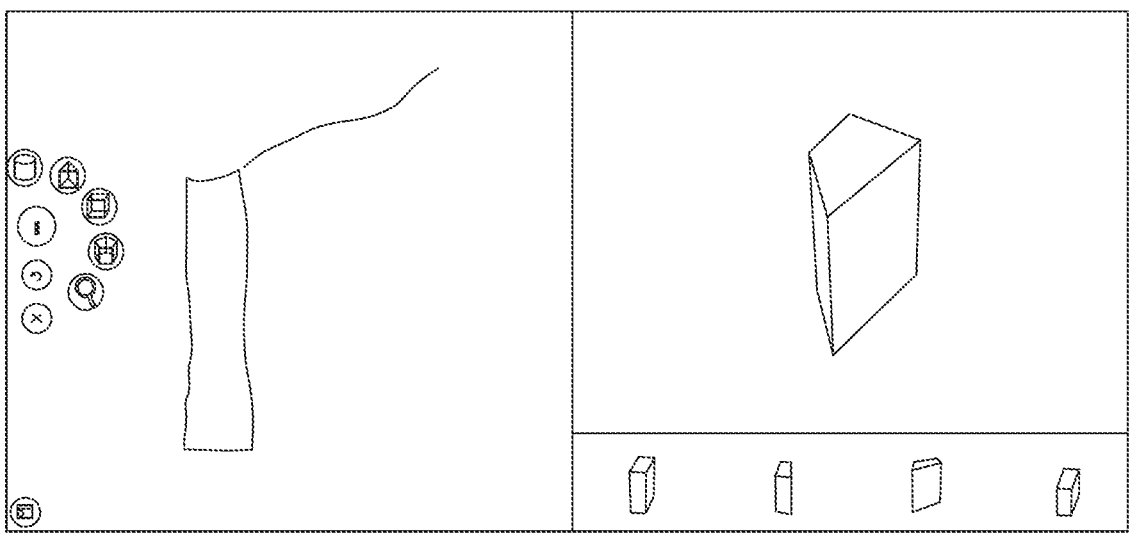
Figure 12:
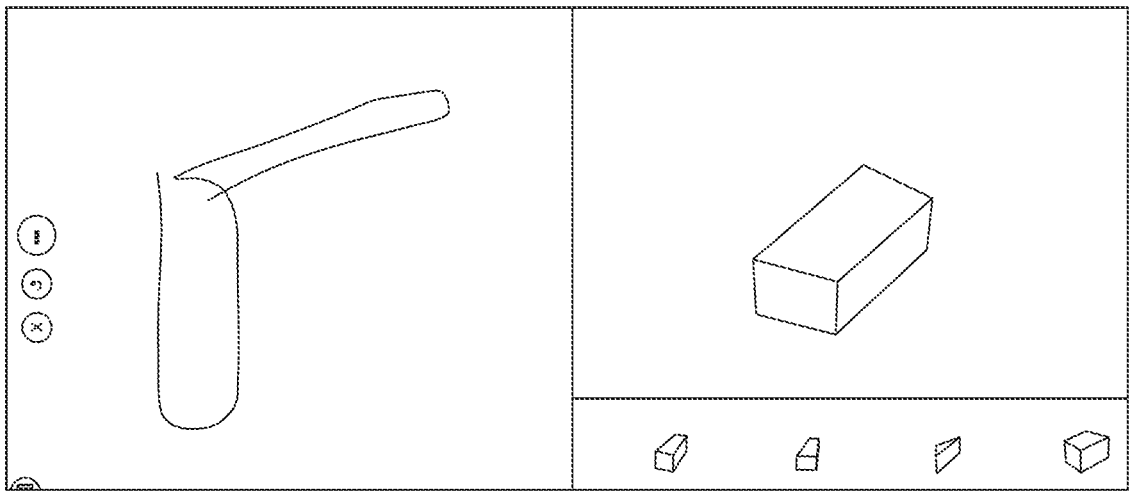

Another example of the 3D design method is discussed in reference to FIG. 12. In this example, the method does not wait for a completed sketch in order to infer a 3D model. The CNN encoder uses the partial information (from the incomplete sketch) and the learned patterns to encode the 2D sketch to data defining a 3D model. In this example, different 3D models are proposed to the user while he/she is still drawing. Further, the user may generate variations in the proposed 3D models from the same sketch and a random variable automatically sampled from N(0, 1), using the VAE architecture. Additionally, or alternatively, the user may also generate a new 3D model by imposing the type of the 3D model, given the same sketch, using the CVAE architecture.

The invention claimed is:

1. A computer-implemented method of machine-learning comprising:
  obtaining an architecture for a neural network which is configured to take as an input a 2D sketch, and to output a 3D model represented by the 2D sketch, the 3D model being a parameterized 3D model defined by a set of parameters consisting of a first subset of one or more parameters and a second subset of one or more parameters, and the neural network is configured to selectively:

output a value for the set, and take as input a value for the first subset from a user, and output a value for the second subset; and teaching the neural network;

wherein the architecture comprises a piece of data, the neural network being configured;

to selectively output a value for the set, to produce a first value for the piece of data, to determine the value for the first subset based on said first value for the piece of data, and to further determine the value for the second subset based on said first value for the piece of data, and to selectively take as input the value for the first subset from the user and output the value of the second subset, to produce a second value for the piece of data based on the value for the first subset, to output the value for the second subset based on the second value for the piece of data.

2. The method of machine-learning of claim 1, wherein the value for the first subset corresponds to an image of a function of the first value for the piece of data, the second value being a preimage of the value for the first subset according to the function.

3. The method of machine-learning of claim 2, wherein the piece of data is a vector which represents a probability distribution for the first subset, and the function is an argmax function.

4. The method of machine-learning of claim 3, wherein the second value of the piece of data is a vector having a value of 1 for coordinates corresponding to the value for the first subset, and a value of 0 for all other coordinates.

5. The method of machine-learning of claim 1, wherein the 3D model is defined by a section and an extrusion, the first subset consisting of a number representing a type of the section.

6. The method of machine-learning of claim 5, wherein the number represents a number of sides forming the section.

7. The method of machine-learning of claim 5, wherein the second subset comprises a parameter defining the extrusion and/or a parameter further defining the section.

8. The method of machine-learning of claim 7, wherein the parameter further defining the section comprises a list of positional parameters, each positional parameter optionally comprising one couple of 3D points.

9. The method of machine-learning of claim 8, wherein the neural network comprises a recurrent neural network configured to output a value for the list, the neural network being optionally further configured to output a value for the extrusion based on a final state of the recurrent neural network.

10. A computer-implemented method of 3D design, comprising:

obtaining a neural network taught according to a method of machine-learning including:

obtaining an architecture for a neural network which is configured to take as an input a 2D sketch, and to output a 3D model represented by the 2D sketch, the 3D model being a parameterized 3D model defined by a set of parameters consisting of a first subset of one or more parameters and a second subset of one or more parameters, and the neural network is configured to selectively:

output a value for the set, and take as input a value for the first subset from a user, and output a value for the second subset; and teaching the neural network;

obtaining a 2D sketch;

obtaining, from a user, a value for the first subset; and applying the neural network to the 2D sketch and taking as input the value for the first subset from the user, to output a value for the second subset, wherein the architecture comprises a piece of data, the neural network being configured to:

selectively output a value for the set, to produce a first value for the piece of data, to determine the value for the first subset based on said first value for the piece of data, and to further determine the value for the second subset based on said first value for the piece of data, and selectively take as input the value for the first subset from the user and output the value of the second subset, to produce a second value for the piece of data based on the value for the first subset, to output the value for the second subset based on the second value for the piece of data.

11. The method of 3D design of claim 10, wherein the method further comprises, prior to obtaining the value for the first subset:

applying the neural network to the 2D sketch, to output one or more respective values each for the set; and displaying one or more 3D models represented by the 2D sketch, each 3D model defined by a respective value outputted for the set, the value for the first subset being obtained while the one or more 3D models are displayed.

12. The method of 3D design of claim 10, wherein the value for the first subset corresponds to an image of a function of the first value for the piece of data, the second value being a preimage of the value for the first subset according to the function.

13. The method of 3D design of claim 12, wherein the piece of data is a vector which represents a probability distribution for the first subset, and the function is an argmax function.

14. The method of 3D design of claim 10, wherein the 3D model is defined by a section and an extrusion, the first subset consisting of a number representing a type of the section.

15. A device comprising:

a processor; and a non-transitory memory having recorded thereon a computer program comprising instructions that when executed by the processor causes the processor to perform machine-learning by being configured to:

obtain an architecture for a neural network which is configured to take as an input a 2D sketch, and to output a 3D model represented by the 2D sketch, the 3D model being a parameterized 3D model defined by a set of parameters consisting of a first subset of one or more parameters and a second subset of one or more parameters, and the neural network is configured to selectively:

output a value for the set, and take as input a value for the first subset from a user, and output a value for the second subset; and teach the neural network; and/or
causes the processor to perform 3D design by being configured to:
obtain a neural network taught according to machine-learning by being configured to:
obtain the architecture for the neural network which is configured to take as the input the 2D sketch, and to output the 3D model represented by the 2D sketch, the 3D model being a parameterized 3D model defined by the set of parameters consisting of the first subset of one or more parameters and the second subset of one or more parameters, and the neural network is configured to selectively:
output the value for the set, and
take as input the value for the first subset from the user, and
output the value for the second subset; and
teach the neural network;
obtain a 2D sketch;
obtain, from the user, a value for the first subset; and
apply the neural network to the 2D sketch and taking as input the value for the first subset from the user, to output a value for the second subset, wherein the architecture comprises a piece of data, the neural network being configured to:
selectively output a value for the set, to produce a first value for the piece of data, to determine the value for the first subset based on said first value for the piece of data, and to further determine the value for the second subset based on said first value for the piece of data; and
selectively take as input the value for the first subset from the user and output the value of the second subset, to produce a second value for the piece of data based on the value for the first subset, to output the value for the second subset based on the second value for the piece of data.

16. The device of claim 15, wherein the value for the first subset corresponds to an image of a function of the first value for the piece of data, the second value being a preimage of the value for the first subset according to the function.

17. The device of claim 16, wherein the piece of data is a vector which represents a probability distribution for the first subset, and the function is an argmax function.

\* \* \* \* \*